(12) United States Patent
Liu et al.

(10) Patent No.: US 12,167,664 B2
(45) Date of Patent: Dec. 10, 2024

(54) DISPLAY PANEL HAVING TOUCH ELECTRODE LEADS ARRANGED BETWEEN SUBSTRATE AND DAM STRUCTURE AND PREPARATION METHOD THEREFOR, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Yangsheng Liu, Beijing (CN); Xuwu Hu, Beijing (CN); Hwang Kim, Beijing (CN); Wei Lin, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 554 days.

(21) Appl. No.: 17/427,107

(22) PCT Filed: Jan. 6, 2021

(86) PCT No.: PCT/CN2021/070508
§ 371 (c)(1),
(2) Date: Jul. 30, 2021

(87) PCT Pub. No.: WO2021/139693
PCT Pub. Date: Jul. 15, 2021

(65) Prior Publication Data
US 2022/0102434 A1    Mar. 31, 2022

(30) Foreign Application Priority Data

Jan. 7, 2020 (CN) .......................... 202010012774.1

(51) Int. Cl.
*H10K 59/40*    (2023.01)
*G06F 3/041*    (2006.01)
(Continued)

(52) U.S. Cl.
CPC ........... *H10K 59/40* (2023.02); *G06F 3/0412* (2013.01); *G06F 3/04164* (2019.05);
(Continued)

(58) Field of Classification Search
CPC ...... H10K 59/40; H10K 50/844; H10K 71/00; H10K 50/81; H10K 59/1201;
(Continued)

(56) References Cited

U.S. PATENT DOCUMENTS

2015/0228704 A1    8/2015    Miyake et al.
2018/0053810 A1    2/2018    Jin et al.
(Continued)

FOREIGN PATENT DOCUMENTS

CN    106951125 A    7/2017
CN    107068720 A    8/2017
(Continued)

OTHER PUBLICATIONS

International Search Report for PCT/CN2021/070508 Mailed Mar. 31, 2021.
(Continued)

*Primary Examiner* — Benjamin P Sandvik
*Assistant Examiner* — John Patrick Cornely
(74) *Attorney, Agent, or Firm* — Ling Wu; Stephen Yang; Ling and Yang Intellectual Property

(57) ABSTRACT

A display panel and a preparation method therefor, and a display apparatus. The display panel comprises: a display region and a bezel region surrounding the display region; a barrier structure, located in the bezel region and arranged on one side of the base substrate, surrounding the display
(Continued)

region; a touch-control electrode lead, comprising a first metal lead and a metal connection bridge which are electrically connected; said first metal lead is arranged on the upper side of said barrier structure; the first metal lead extends from the display region to the bezel region and is located on the side of the barrier structure facing the display region; said metal connection bridge is located in the bezel region; the metal connection bridge is arranged between the base substrate and the surface of the barrier structure on the side away from the base substrate.

15 Claims, 11 Drawing Sheets

(51) Int. Cl.
*H10K 50/844* (2023.01)
*H10K 71/00* (2023.01)
*G06F 3/044* (2006.01)
*H10K 50/81* (2023.01)
*H10K 59/12* (2023.01)
*H10K 59/122* (2023.01)
*H10K 59/124* (2023.01)

(52) U.S. Cl.
CPC ........... *H10K 50/844* (2023.02); *H10K 71/00* (2023.02); *G06F 3/0446* (2019.05); *G06F 2203/04103* (2013.01); *G06F 2203/04111* (2013.01); *H10K 50/81* (2023.02); *H10K 59/1201* (2023.02); *H10K 59/122* (2023.02); *H10K 59/124* (2023.02)

(58) Field of Classification Search
CPC .. H10K 59/122; H10K 59/124; H10K 59/131; H10K 59/88; G06F 3/0412; G06F 3/04164; G06F 3/0446; G06F 2203/04103; G06F 2203/04111
See application file for complete search history.

(56) References Cited

U.S. PATENT DOCUMENTS

| | | | |
|---|---|---|---|
| 2018/0059862 A1 | 3/2018 | Zeng et al. | |
| 2021/0165517 A1* | 6/2021 | Lee | G06F 3/0412 |

FOREIGN PATENT DOCUMENTS

| | | |
|---|---|---|
| CN | 107180852 A | 9/2017 |
| CN | 107491209 A | 12/2017 |
| CN | 109634467 A | 4/2019 |
| CN | 111106156 A | 5/2020 |
| JP | 2015-180924 A | 10/2015 |
| JP | 2006-310106 A | 11/2016 |

OTHER PUBLICATIONS

Office Action dated Apr. 1, 2021 for Chinese Patent Application No. 202010012774.1 and English Translation.

Decision to grant dated Oct. 26, 2021 for Chinese Patent Application No. 202010012774.1 and English Translation.

* cited by examiner

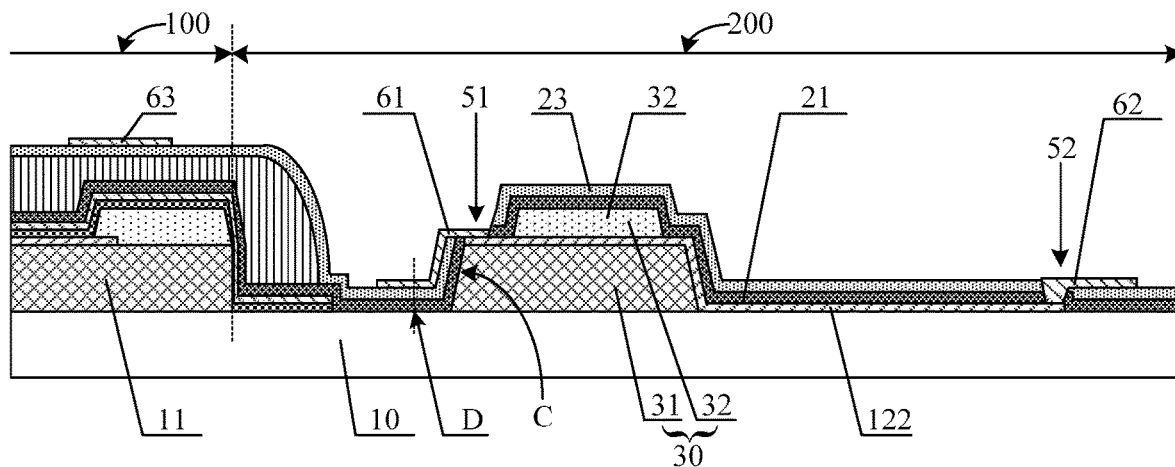

FIG. 4

Forming a dam structure and metal connecting bridges located on a substrate base plate in a frame region, wherein the metal connecting bridges are arranged between the substrate base plate and a surface of the dam structure away from the substrate base plate Forming first metal leads located on a side of the dam structure facing away from the substrate base plate in the frame region, wherein the first metal leads extend from the display region to the frame region, are located on a side of the dam structure facing a display region, and are electrically connected to the metal connecting bridges

FIG. 5

DISPLAY PANEL HAVING TOUCH ELECTRODE LEADS ARRANGED BETWEEN SUBSTRATE AND DAM STRUCTURE AND PREPARATION METHOD THEREFOR, AND DISPLAY APPARATUS

CROSS-REFERENCE TO RELATED APPLICATIONS

The present application is a U.S. National Phase Entry of International Application PCT/CN2020/070508 having an international filing date of Jan. 6, 2021, which claims priority of Chinese Patent Application No. 202010012774.1, filed to the CNIPA on Jan. 7, 2020 and entitled "Display Panel and Preparation Method therefor, and Display Apparatus", the contents of which should be interpreted as being hereby incorporated by reference.

TECHNICAL FIELD

Embodiments of the present disclosure relate to, but not limited to, the technical field of touch display, and in particular to a display panel, a method for manufacturing a display panel, and a display device.

BACKGROUND

An Organic Light Emitting Diode (OLED) is an active light emitting display device, which has the advantages of self-illumination, wide viewing angle, high contrast, low power consumption, fast response, etc. OLED displays are widely accepted by customers because of their bright color, low power consumption, thinness, bendability, and other advantages. With the continuous development of display technology, OLED technology is increasingly applied to various display devices, especially in smart terminal products such as mobile phones and tablet computers.

An OLED display panel usually adopts a Thin Film Encapsulation (TFE) structure of inorganic encapsulation layer-organic encapsulation layer-inorganic encapsulation layer to achieve encapsulation, so that organic light emitting materials are encapsulated inside the panel, thereby achieving the purpose of blocking water and oxygen, and protecting the organic light emitting materials.

In order to achieve touch display of an OLED display panel, touch electrode are usually arranged on a TFE film layer of the OLED display panel. In order to achieve control of the touch electrodes, multiple metal leads which are correspondingly and electrically connected to the touch electrodes may be formed on the TFE film layer, and each of the multiple metal leads extends across from a display region to a bezel region.

SUMMARY

The following is an overview of the subject matter described in detail herein. The overview is not intended to limit the scope of protection of the claims.

An embodiment of the present disclosure provides a display panel, which includes:
  a substrate base plate, including a display region and a bezel region surrounding the display region;
  a light emitting element, arranged on a side of the substrate base plate and located in the display region;
  a dam structure, located in the bezel region and arranged on the side of the substrate base plate provided with the light emitting element, wherein the dam structure surrounds the display region;
  touch electrodes, arranged on a side of the light emitting element away from the substrate base plate, and located in the display region; and
  touch electrode leads, including first metal leads and metal connection bridges which are electrically connected, wherein the first metal leads are arranged on a side of the dam structure facing away from the substrate base plate, the first metal leads are electrically connected to the touch electrodes, extend from the display region to the bezel region, and are located on a side of the dam structure facing the display region, and the metal connection bridges are located in the bezel region, and are arranged between the substrate base plate and a surface of the dam structure away from the substrate base plate.

An embodiment of the present disclosure provides a method for manufacturing a display panel. The display panel includes a display region and a bezel region. The method includes:
  forming a dam structure and metal connection bridges located on a substrate base plate in the bezel region, wherein the metal connection bridges are arranged between the substrate base plate and a surface of the dam structure away from the substrate base plate; and
  forming, in the bezel region, first metal leads located on a side of the dam structure facing away from the substrate base plate, wherein the first metal leads extend from the display region to the bezel region, and are located on a side of the dam structure facing the display region, and the first metal leads are electrically connected to the metal connection bridges.

An embodiment of the present disclosure provides a display device, including the above-described display panel.

Other aspects will become apparent upon reading and understanding the accompanying drawings and detailed description.

BRIEF DESCRIPTION OF DRAWINGS

The accompanying drawings are used to provide an understanding of the technical solutions of the present disclosure, constitute a part of the description, and serve to explain technical solutions of the present disclosure together with embodiments of the present disclosure, and are not to be construed as limitations on the technical solutions of the present disclosure.

FIG. 4 is a schematic view showing a cross-sectional structure along B-B of a display panel according to an exemplary embodiment of the present disclosure.

FIG. 5 is a schematic view of a process for manufacturing a display panel.

DETAILED DESCRIPTION

The embodiments of the present disclosure are described below with reference to the accompanying drawings. The embodiments in the present disclosure and the features in the embodiments may be randomly combined with each other if there is no conflict.

After an OLED display panel adopts a Thin Film Encapsulation (TFE) structure of inorganic encapsulation layer-organic encapsulation layer-inorganic encapsulation layer, organic light emitting materials may be encapsulated inside the panel, thereby improving the water and oxygen barrier performance of the panel. However, the bonding property between the inorganic encapsulation layer (the material of which is silicon nitride for example) with its underlying material does not provide a completely ideal effect of blocking water and oxygen, and water and oxygen may still invade into the OLED from a peripheral position of a TFE film layer along an interface between the TFE and an underlying film layer.

In order to avoid water and oxygen invasion, a dam structure is manufactured on the periphery of a display region, i.e. in a bezel region, before a TFE process is carried out. The dam structure includes a convex first dam close to the display region and a convex second dam located on a side of the first dam facing away from the display region. The dam structure (the first dam and the second dam) is covered by a first inorganic encapsulation layer and a second inorganic encapsulation layer of the TFE. In an aging test, it is found that in an environment of high temperature and high humidity, compared with a display panel provided with a dam structure, problems will occur easily and faster to an organic light emitting material of a display panel without a dam structure. Therefore, after the display panel is provided with the dam structure, the water and oxygen barrier performance of the display panel is greatly improved.

Figure 1A:
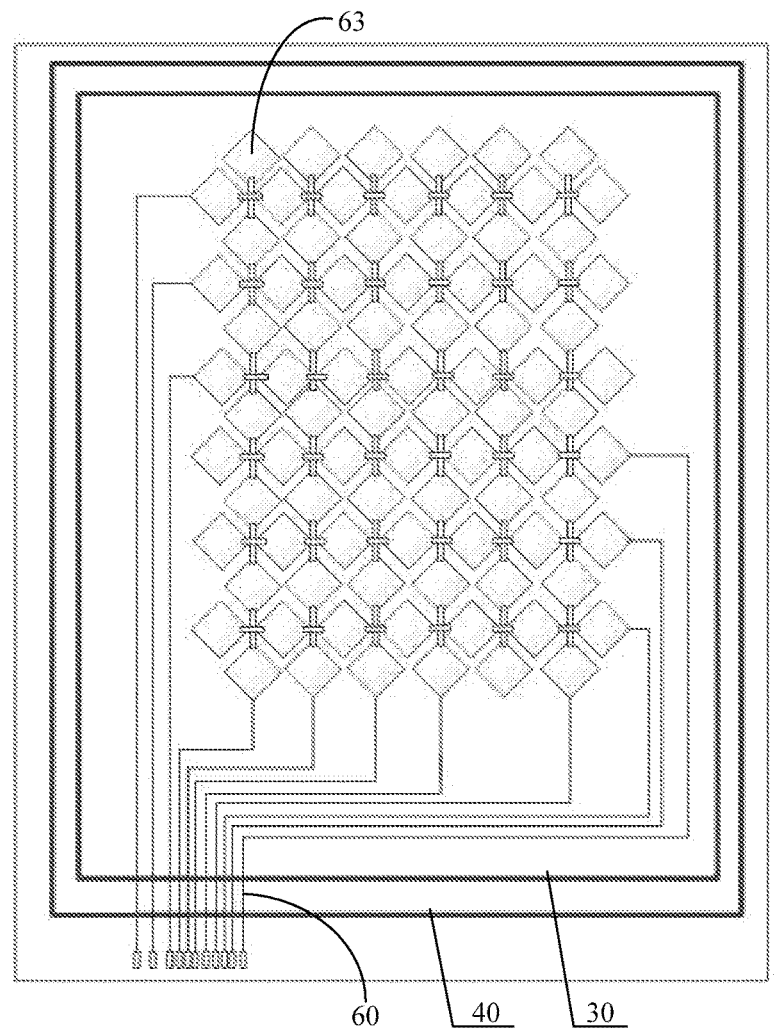
FIG. 1a is a schematic view showing a planar structure of an OLED display panel after touch electrodes are arranged thereon.
Figure 1B:
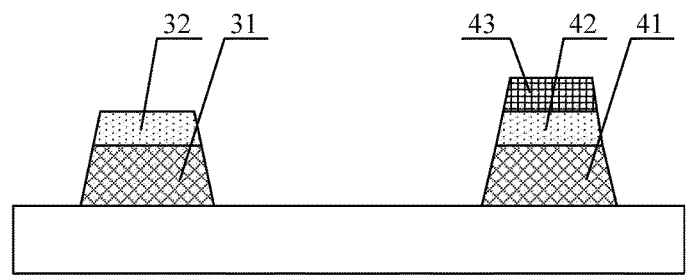
FIG. 1b is a schematic cross-sectional view of a dam structure of a display panel.

FIG. 1a is a schematic view showing a planar structure of an OLED display panel after touch electrodes are arranged thereon. FIG. 1b is a schematic cross-sectional view of a dam structure of a display panel. Multiple touch electrodes 63 and multiple metal leads 60 are arranged on a TFE film layer of the OLED display panel. The metal leads 60 are electrically connected to corresponding touch electrode rows or touch electrode columns. The metal leads 60 extend from a display region to a bezel region, as shown in FIG. 1a. The metal leads 60 may cross the dam structure (a first dam 30 and a second dam 40). Each of the first dam 30 and the second dam 40 may be formed by stacking multiple sub-dams, as shown in FIG. 1b. The first dam 30 includes a first sub-dam 31 and a second sub-dam 32 which are sequentially stacked. The second dam 40 includes a third sub-dam 41, a fourth sub-dam 42, and a fifth sub-dam 43 which are sequentially stacked. It is generally desirable that side walls of the sequentially stacked sub-dams may be smoothly connected with each other for transition, but in actual production, it is difficult to make the side walls of the sequentially stacked sub-dams smoothly connected with each other for transition, so that not only the finally formed dams are high, but also the side walls of the sequentially stacked sub-dams are uneven, and a slope angle of the whole dam is not uniform. When the metal leads 60 are formed subsequently, the metal leads 60 needs to cross the first dam 30 and the second dam 40. Since the height of the dam is large and the slope angle is not uniform, photoresist residue may occur in a process of forming the metal leads 60, so that poor etching is caused, metal residue is generated at the foot of the dam, the residual metal causes short circuits to occur between different metal leads, and the product yield is reduced.

An embodiment of the present disclosure proposes a display panel. The display panel includes:
  a substrate base plate, including a display region and a bezel region surrounding the display region;
  a light emitting element, arranged on a side of the substrate base plate and located in the display region;

a dam structure, located in the bezel region and arranged on the side of the substrate base plate provided with the light emitting element, wherein the dam structure surrounds the display region;

touch electrodes, arranged on a side of the light emitting element away from the substrate base plate, and located in the display region; and touch electrode leads, including first metal leads and metal connection bridges which are electrically connected, wherein the first metal leads are arranged on a side of the dam structure facing away from the substrate base plate, the first metal leads are electrically connected to the touch electrodes, extend from the display region to the bezel region, and are located on a side of the dam structure facing the display region, and the metal connection bridges are located in the bezel region, and are arranged between the substrate base plate and a surface of the dam structure away from the substrate base plate.

In the display panel of the embodiment of the present disclosure, the touch electrode leads include the first metal leads and the metal connection bridges which are electrically connected. The first metal leads are arranged on the side of the dam structure facing away from the substrate base plate. The metal connection bridges are arranged between the substrate base plate and the surface of the dam structure away from the substrate base plate. Therefore, the first metal leads and the metal connection bridges do not need to cross the dam structure, the influence of the dam structure on a manufacturing procedure of the metal leads is avoided, photoresist residue and poor etching are avoided, and the short circuit problem between the first metal leads and the short circuit problem between the metal connection bridges are avoided.

Hereinafter, the technical contents of the present disclosure will be described in detail through embodiments. In the following embodiments, "arranged on a same layer" refers to being formed by one patterning process.

Figure 2:
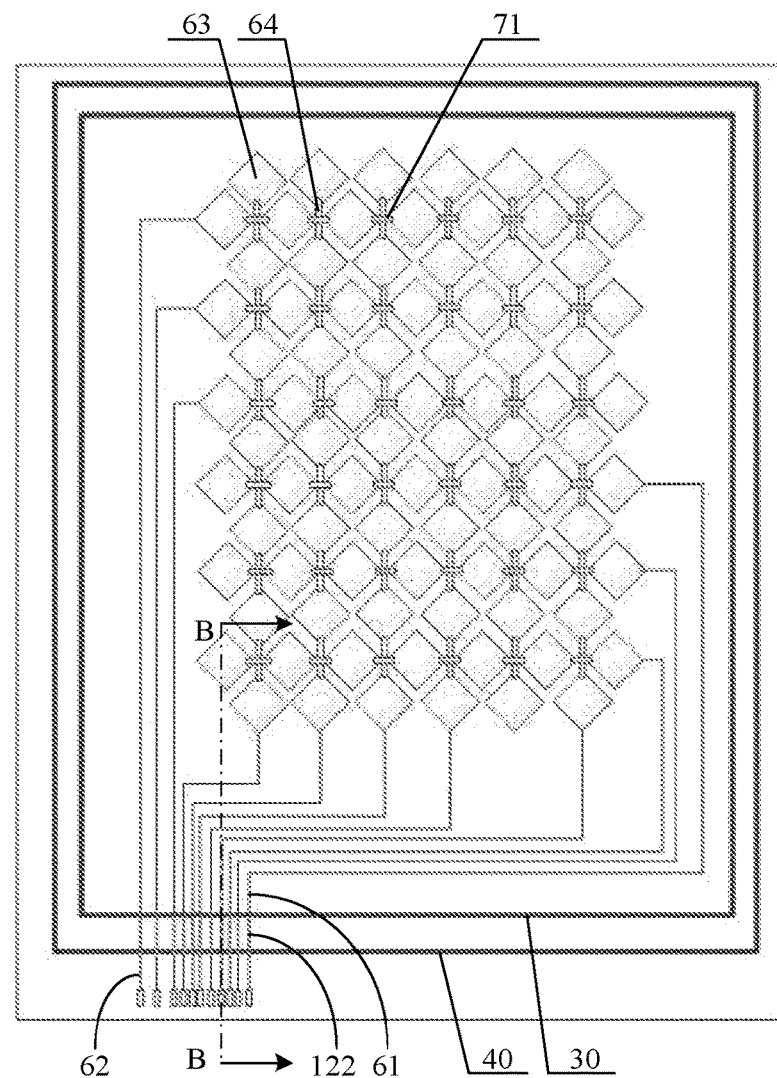
FIG. 2 is a schematic view showing a planar structure of a display panel according to an embodiment of the present disclosure.
Figure 3:
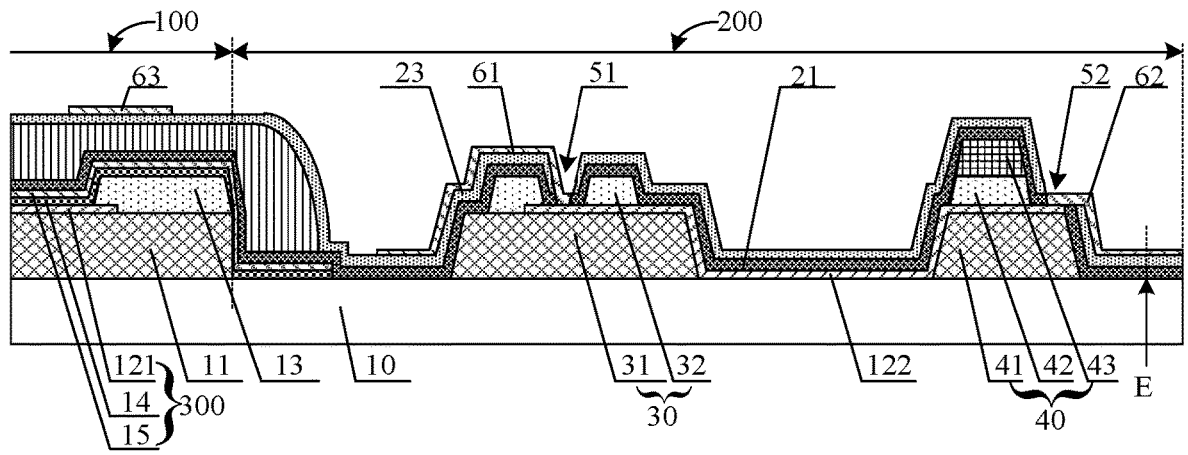
FIG. 3 is a schematic view showing a cross-sectional structure along B-B of the display panel in FIG. 2.

FIG. 2 is a schematic view showing a planar structure of a display panel according to an embodiment of the present disclosure. FIG. 3 is a schematic view showing a cross-sectional structure along B-B of the display panel of FIG. 2. As shown in FIGS. 2 and 3, the display panel includes a display region 100 and a bezel region 200. The display panel includes:

a substrate base plate 10, including the display region 100 and the bezel region 200 surrounding the display region 100;

a light emitting element 300, arranged on a side of the substrate base plate 10 and located in the display region 100;

a dam structure, located in the bezel region 200 and arranged on the side of the substrate base plate 10 provided with the light emitting element 300, wherein the dam structure surrounds the display region 100;

touch electrodes 63, arranged on a side of the light emitting element 300 away from the substrate base plate 10, and located in the display region 100; and touch electrode leads, including first metal leads 61 and metal connection bridges 122 which are electrically connected, wherein the first metal leads 61 are arranged on a side of the dam structure facing away from the substrate base plate 10, the first metal leads 61 are electrically connected to the touch electrodes 63, and the first metal leads 61 extend from the display region 100 to the bezel region 200, and are located on a side of the dam structure facing the display region 100. The metal connection bridges 122 are located in the bezel region 200, and the metal connection bridges 122 are arranged between the substrate base plate 10 and a surface of the dam structure away from the substrate base plate 10.

The metal connection bridges 122 may be arranged between the substrate base plate 10 and the surface of the dam structure away from the substrate base plate 10. That is, the metal connection bridges 122 may be arranged between an upper surface of the dam structure and the substrate base plate 10, as shown in FIG. 3.

In the display panel of the embodiment of the present disclosure, the touch electrode leads includes the first metal leads 61 and the metal connection bridges 122 which are electrically connected. The first metal leads 61 may be arranged on a side, facing away from the substrate base plate 10, of the dam structure. The metal connection bridges 122 may be arranged between the substrate base plate 10 and a surface of the dam structure away from the substrate base plate 10. Therefore, the first metal leads 61 and the metal connection bridges 122 do not need to span the dam structure, the influence of the dam structure on a manufacturing process of the metal leads is avoided, photoresist residue and poor etching are avoided, and the short circuit problem between the first metal leads and the short circuit problem between the metal connection bridges are avoided.

In an exemplary embodiment, as shown in FIG. 3, the display panel may further include an inorganic encapsulation layer (in FIG. 3, the inorganic encapsulation layer includes a first inorganic encapsulation layer 21 and a second inorganic encapsulation layer 23 which are stacked). The inorganic encapsulation layer may be arranged between the dam structure and the first metal leads 61. The first metal leads 61 may be electrically connected to the metal connection bridges 122 by first via holes 51 penetrating through the inorganic encapsulation layer. The inorganic encapsulation layer may improve the water and oxygen barrier performance of the display panel.

A structure of the display region of the display panel may include the substrate base plate 10, a planarization layer 11 arranged on the substrate base plate 10, an anode 121 arranged on the planarization layer 11, a pixel definition layer 13 arranged on the anode 121, an organic light emitting layer 14 arranged on the pixel definition layer, a cathode 15 arranged on the organic light emitting layer 14, an encapsulation structure layer (a first inorganic encapsulation layer 21, an organic encapsulation layer 22, and a second inorganic encapsulation layer 23) arranged on the cathode 15, and the touch electrodes 63 arranged on the encapsulation structure layer. The first metal leads 61 are electrically connected to corresponding touch electrode rows or touch electrode columns. The number of the first metal leads 61 and the metal connection bridges 122 may each be plural, and the first metal leads 61 and the metal connection bridges 122 are electrically connected in one-to-one correspondence.

FIG. 4 is a schematic view showing a cross-sectional structure along B-B of a display panel in an exemplary embodiment of the present disclosure. In an exemplary embodiment, metal connection bridges 122 may penetrate through the dam structure, as shown in FIG. 4.

In an exemplary embodiment, as shown in FIG. 4, the first dam 30 may include a first sub-dam 31 arranged on the substrate base plate 10, and a second sub-dam 32 stacked on a side of the first sub-dam 31 facing away from the substrate base plate 10. The metal connection bridges 122 may be arranged between the first sub-dam 31 and the second sub-dam 32.

With such a structure, as shown in FIG. 4, the metal connection bridges 122 are arranged between the first sub-dam 31 and the second sub-dam 32. The metal connection bridges 122 may cross the first sub-dam 31, height of the individual first sub-dam 31 is small, and a slope angle of a side wall of the first sub-dam 31 is gentle and uniform, so that when multiple metal connection bridges 122 are formed on the first sub-dam 31, photoresist residue and metal residue can be avoided. Therefore, the short circuit problem will not occur between the multiple metal connection bridges 122.

In an exemplary embodiment, as shown in FIG. 4, a side wall (left side wall) of the second sub-dam 32 facing the display region is away from the display region 100 relative to a side wall (left side wall) of the first sub-dam 31 facing the display region. Positions of electric connection between the first metal leads 61 and the metal connection bridges 122 are located on the side of the second sub-dam 32 facing the display region 100, and the positions of electric connection between the first metal leads 61 and the metal connection bridges 122 are located on a surface of the first sub-dam 31 facing the second sub-dam 32. That is, the positions of electric connection (i.e. positions of the first via holes 61) between the first metal leads 61 and the metal connection bridges 122 may be located on a left side of the second sub-dam 32, and the positions of electric connection between the first metal leads 61 and the metal connection bridges 122 may be located on an upper surface of the first sub-dam 31, as shown in FIG. 4.

In an exemplary embodiment, the metal connection bridges 122 may extend to the left side wall of the first sub-dam 31, so that the positions of electric connection between the first metal leads 61 and the metal connection bridges 122 may be located on the side wall (i.e., the left side wall of the first sub-dam 31) of the first sub-dam 31 facing the display region, as shown by position C in FIG. 4.

In an exemplary embodiment, the metal connection bridges 122 may extend to the left side of the first sub-dam 31, and the positions of electric connection between the first metal leads 61 and the metal connection bridges 122 may be located on a side (i.e., the left side of the first sub-dam 31) of the first sub-dam 31 facing the display region, as shown by position D in FIG. 4.

In an exemplary embodiment, as shown in FIGS. 2 and 4, the touch electrode leads may further include second metal leads 62. The second metal leads 62 are arranged on a same layer as the first metal leads 61. The second metal leads 62 and the first metal leads 61 are in one-to-one correspondence. The second metal leads 62 may be arranged on a side (i.e., a right side of the first dam 30) of the first dam 30 away from the display region. The metal connection bridges 122 and the second metal leads 62 are electrically connected on a side of the first dam 30 facing away from the display region. That is, the metal connection bridges 122 and the second metal leads 62 may be electrically connected on the right side of the first dam 30. With such a structure, the second metal leads 62 may be formed on a planar surface on the right side of the first dam 30. In a process of forming the second metal leads 62 on the planar surface, photoresist residue and metal residue can be eliminated, and the short circuit problem between adjacent second metal leads 62 is eliminated, thereby eliminating the short circuit problem of the touch electrode lead.

In an exemplary embodiment, as shown in FIG. 3, the side wall (left side wall) of the second sub-dam 32 facing the display region is away from the display region relative to the side wall (left side wall) of the first sub-dam 31 facing the display region. The second sub-dam 32 may be provided with first via holes 51 exposing the metal connection bridges 122. The first via holes 51 are located on a surface of the first sub-dam 31 facing away from the substrate base plate 10. The first metal leads 61 are electrically connected to the metal connection bridges 122 through the first via holes 51. The left side wall of the second sub-dam 32 is away from the display region relative to the left side wall of the first sub-dam 31, so that the left side of the first sub-dam 31 and the left side of the second sub-dam 32 form a stepped transition. In the process of forming the first metal leads 61, photoresist and metal residues on the left side of the first sub-dam 31 and the left side of the second sub-dam 32 can be avoided, and short circuit between adjacent first metal leads 61 can be avoided.

In an exemplary embodiment, as shown in FIG. 3, the dam structure further includes a second dam 40. The second dam 40 is arranged on the side of the first dam 30 facing away from the display region 100. The touch electrode leads further includes second metal leads 62. The second metal leads 62 are arranged on the same layer as the first metal leads 61. The second metal leads 62 may be arranged on a side of the second dam 40 away from the display region 100. The metal connection bridges 122 and the second metal leads 62 are electrically connected on a side of the second dam 40 facing away from the display region. That is, the metal connection bridges 122 and the second metal leads 62 may be electrically connected on a right side of a right side wall connecting line of the second dam 40.

In an exemplary embodiment, as shown in FIG. 3, the second dam 40 includes a third sub-dam 41 arranged on the substrate base plate 10, and a fourth sub-dam 42 stacked on a side of the third sub-dam 41 facing away from the substrate base plate 10. In an exemplary embodiment, the first sub-dam 31 and the third sub-dam 41 may be arranged on a same layer, and the second sub-dam 32 and the fourth sub-dam 42 may be arranged on a same layer. The metal connection bridges 122 may be arranged between the third sub-dam 41 and the fourth sub-dam 42. The metal connection bridges 122 are arranged between the third sub-dam 41 and the fourth sub-dam 42. The metal connection bridges 122 may cross the third sub-dam 41, the height of the individual third sub-dam 41 is small, and a slope angle of a side wall of the third sub-dam 41 is gentle and uniform, so that when multiple metal connection bridges 122 are formed on the third sub-dam 41, photoresist residue and metal residue will not occur. Therefore, the short circuit problem will not occur between the multiple metal connection bridges 122.

In an exemplary embodiment, as shown in FIG. 3, a side wall (right side wall) of the fourth sub-dam 42 facing away from the display region is close to the display region relative to a side wall (right side wall) of the third sub-dam 41 facing away from the display region. The positions of electric connection between the metal connection bridges 122 and the second metal leads 62 may be located on a side of the fourth sub-dam 42 facing away from the display region, and the positions of electric connection between the metal connection bridges 122 and the second metal leads 62 may be located on a surface of the third sub-dam 41 facing away from the substrate base plate 10. In this case, the second metal leads 62 may be arranged on the right side wall of the third sub-dam 41. A slope angle of the right side wall of the third sub-dam 41 is uniform, so that the photoresist residue in the process of forming the second metal leads 62 is avoided, the metal residue is avoided, and the short circuit problem between the second metal leads 62 is avoided.

In an exemplary embodiment, the inorganic encapsulation layer may be arranged between the dam structure and the second metal leads 62. Therefore, the second metal leads 62 may be electrically connected to the metal connection bridges 122 by second via holes 52 penetrating through the inorganic encapsulation layer. In FIG. 3, the second via holes 52 are located on a side of the fourth sub-dam 42 facing away from the display region, and the second via holes 52 are located on the surface of the third sub-dam 41 facing away from the substrate base plate 10.

In an exemplary embodiment, the metal connection bridges 122 may extend to the right side wall of the third sub-dam 41, so that the positions of electric connection (i.e. the second via holes 52) between the metal connection bridges 122 and the second metal leads 62 may be located on the side wall (right side wall) of the third sub-dam 41 facing away from the display region.

In an exemplary embodiment, the metal connection bridges 122 may extend to a side of the third sub-dam 41 away from the display region, so that the positions of electric connection (i.e. the second via holes 52) between the metal connection bridges 122 and the second metal leads 62 may be located on a side of the third sub-dam 41 facing away from the display region, as shown by position E in FIG. 3. The positions of electric connection (i.e. the second via holes 52) between the metal connection bridges 122 and the second metal leads 62 may be located on the side wall (right side wall) of the third sub-dam 41 facing away from the display region. In this case, the second metal leads may be formed on a planar surface of the inorganic insulating layer on a side of the third sub-dam 41 away from the display region. Therefore, when forming the second metal leads on the planar surface, photoresist residue and metal residue can be eliminated, and the short circuit problem between the second metal leads is eliminated.

In an embodiment, the first sub-dam 31, the third sub-dam 41, and the planarization layer 11 may be arranged on a same layer. The metal connection bridges 122 and the anode 121 may be arranged on a same layer. The second sub-dam 32, the fourth sub-dam 42, and the pixel definition layer 13 may be arranged on a same layer. Thus, the anode 121 and the metal connection bridges 122 may be formed at the same time without affecting the manufacturing process of the display panel, and the cost is reduced.

In an exemplary embodiment, as shown in FIG. 3, the second dam 40 may further include a fifth sub-dam 43 arranged on a side of the fourth sub-dam 42 facing away from the substrate base plate 10. The height of the first dam 30 may be smaller than that of the second dam 40. "Height" is a dimension of a dam in a direction perpendicular to the substrate base plate.

The structure of the second dam 40 may be combined into the embodiment shown in FIG. 4.

Hereinafter, the technical solutions of the embodiments of the present disclosure will be explained by a manufacturing process of the display panel shown in FIG. 3. It will be readily understood that when the material of "patterning" in an embodiment of the present disclosure is an inorganic material or metal, "patterning" includes processes such as photoresist coating, mask exposure, development, etching, or photoresist stripping, and when the material of patterning is an organic material, "patterning" includes processes such as mask exposure and development.

FIG. 5 is a schematic view of a process for manufacturing a display panel. In an exemplary embodiment, a method for manufacturing a display panel is provided. The display panel includes a display region and a bezel region surrounding the display region. The method for manufacturing the display panel, as shown in FIG. 5, may include:

In S1, a dam structure and metal connection bridges located on a substrate base plate are formed in the bezel region. The metal connection bridges are arranged between the substrate base plate and a surface of the dam structure away from the substrate base plate; and In S2, first metal leads located on a side of the dam structure facing away from the substrate base plate are formed in the bezel region, wherein the first metal leads extend from the display region to the bezel region, the first metal leads are located on a side of the dam structure facing the display region, and are electrically connected to the metal connection bridges.

In an exemplary embodiment, S1 may include S111-S116.

In S111, a substrate base plate 10 is provided. In a display region, the substrate base plate 10 may include a drive structure such as a thin film transistor.

Figure 6A:
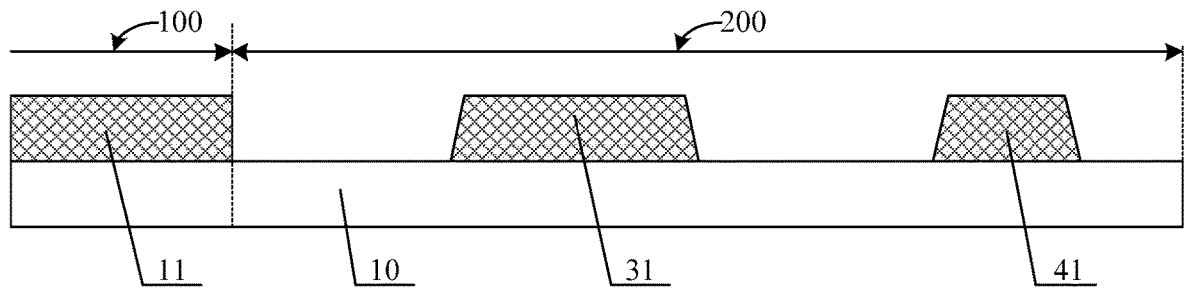
FIG. 6a is a schematic view showing a structure of a display panel after a first sub-dam and a third sub-dam are formed therein.

In S112, a planarization layer 11 located in the display region and a first sub-dam 31 and a third sub-dam 41 located in a bezel region are formed on the substrate base plate 10. The first sub-dam is located on a side of the third sub-dam facing the display region. The step may include: forming a planar thin film on the substrate base plate 10; and patterning the planar thin film to form a planarization layer 11 located in the display region, retaining the planar thin film at a first dam position and a second dam position, forming a first sub-dam 31 located at the first dam position and a third sub-dam 41 located at the second dam position, and removing the planar thin film at other positions, as shown in FIG. 6a. FIG. 6a is a schematic view showing a structure of a display panel after a first sub-dam and a third sub-dam are formed therein. A material of the planar thin film may include an organic material, and the planar thin film is formed by using a coating process.

Figure 6B:
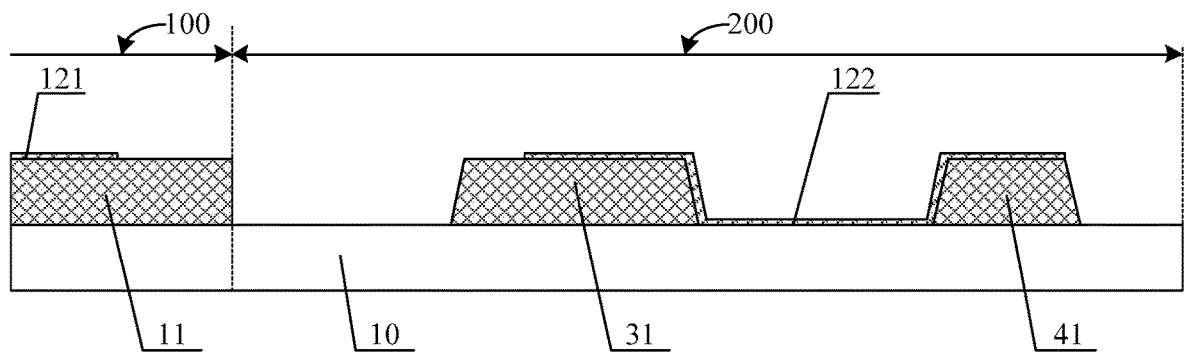
FIG. 6b is a schematic view showing a structure of a display panel after a metal connection bridge is formed therein.

In S113, an anode located in the display region and metal connection bridges located in the bezel region are formed on the substrate base plate with the foregoing pattern formed. The step may include: depositing a first metal thin film on the substrate base plate 10 with the foregoing pattern formed; and patterning the first metal thin film to form an anode 121 on the planarization layer 11 in the display region, and form metal connection bridges 122 on the first sub-dam 31 and the third sub-dam 41 in the bezel region. The metal connection bridges 122 extends from a surface (upper surface) of the first sub-dam 31 facing away from the substrate base plate 10 to a surface (upper surface) of the third sub-dam 41 facing away from the substrate base plate 10. The first metal thin film at other positions is removed, as shown in FIG. 6b. FIG. 6b is a schematic view showing a structure of a display panel after a metal connection bridge is formed therein. A material of the first metal thin film may be selected from materials commonly used for anodes in OLED devices, which is not limited here.

Figure 6C:
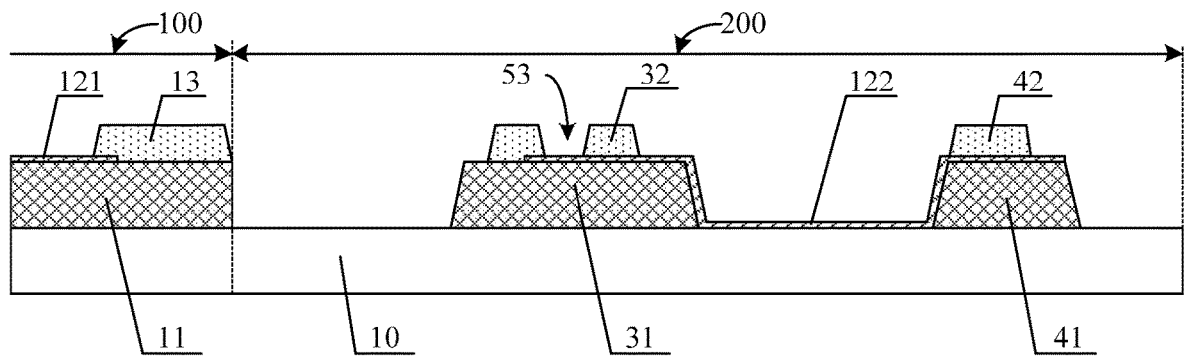
FIG. 6c is a schematic view showing a structure of a display panel after a second sub-dam and a fourth sub-dam are formed therein.

In S114, a pixel definition layer located in the display region and a second sub-dam and a fourth sub-dam located in the bezel region are formed on the substrate base plate with the foregoing pattern formed. The step may include: forming a pixel definition thin film on the substrate base plate 10 with the foregoing pattern formed; and patterning the pixel definition thin film to form a pixel definition layer 13 on the anode 121 in the display region, form a second sub-dam 32 stacked on the first sub-dam 31 on the metal connection bridges 122, forming a fourth sub-dam 42 stacked on the third sub-dam 41 on the metal connection bridges 122, and removing the pixel definition thin film at other positions, as shown in FIG. 6c. FIG. 6c is a schematic view showing a structure of a display panel after a second sub-dam and a fourth sub-dam are formed therein. The second sub-dam 32 is provided with transition via holes 53 for exposing the metal connection bridges 122, and the transition via holes 53 are located on an upper surface of the first sub-dam 31. A side wall of the second sub-dam 32 facing the display region is away from the display region relative to a side wall of the first sub-dam 31 facing the display region, so that a left side of a surface of the first sub-dam 31 facing away from the substrate base plate 10 is exposed. Thus, a stepped transition is formed between a left side wall of the first sub-dam 31 and a left side wall of the second sub-dam 32. A side wall of the fourth sub-dam 42 facing away from the display region is close to the display region relative to a side wall of the third sub-dam 41 facing away from the display region, so that the metal connection bridges 122 are exposed on a side of the fourth sub-dam 42 facing away from the display region, as shown in FIG. 6c.

Figure 6D:
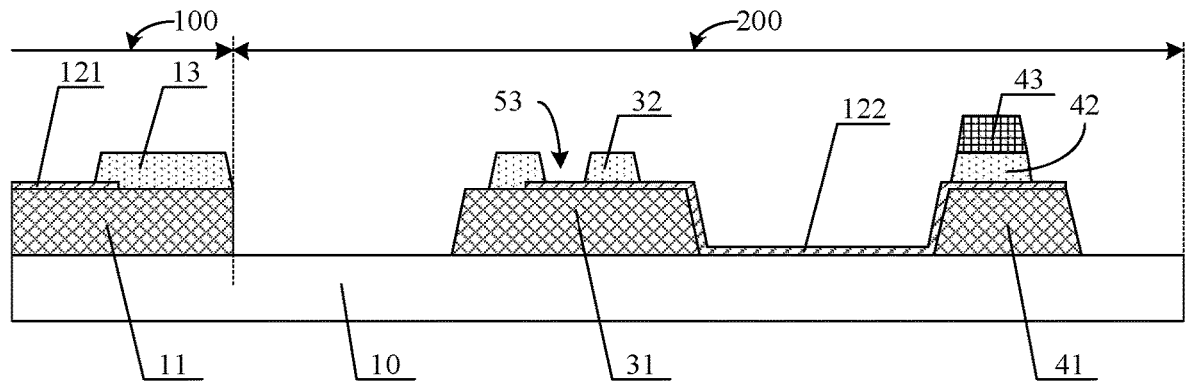
FIG. 6d is a schematic view showing a structure of a display panel with a fifth sub-dam formed therein.

In S115, a fifth sub-dam 43 stacked on the fourth sub-dam 42 is formed on the substrate base plate with the foregoing pattern formed. The step may include: forming a spacer thin film on the substrate base plate with the foregoing pattern formed; and patterning the spacer thin film to form a first spacer post (i.e. the fifth sub-dam 43) stacked on the fourth sub-dam 42, and removing the spacer thin film at other positions, as shown in FIG. 6d. FIG. 6d is a schematic view showing a structure of a display panel after a fifth sub-dam is formed therein.

Figure 6E:
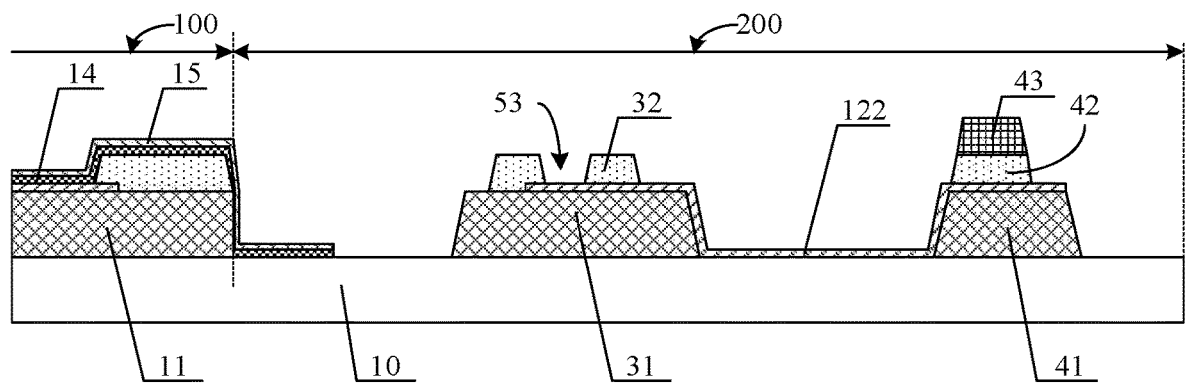
FIG. 6e is a schematic view showing a structure of a display panel after a cathode layer is formed therein.

In S116, an organic light emitting layer and a cathode layer located in the display region are sequentially formed on the substrate base plate with the foregoing pattern formed. The step may include: sequentially forming an organic light emitting layer 14 and a cathode layer 15 in the display region by using an evaporation process, as shown in FIG. 6e. FIG. 6e is a schematic view showing a structure of a display panel after a cathode layer is formed therein.

In an exemplary embodiment, S2 may include S211-S216.

Figure 7A:
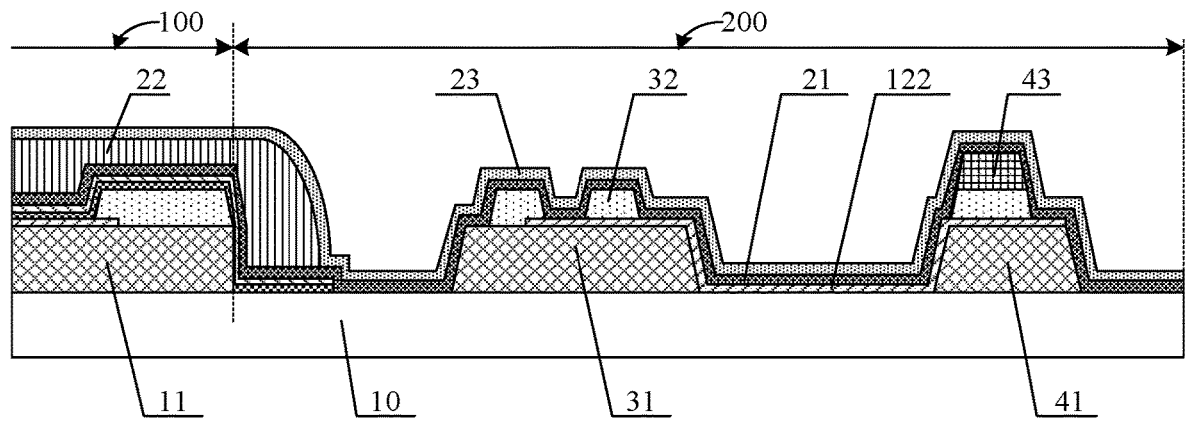
FIG. 7a is a schematic view showing a structure of a display panel after a thin film encapsulation structure layer is formed therein.

In S211, a thin film encapsulation structure layer is formed on the substrate base plate with the foregoing pattern formed. The step may include: forming a first inorganic encapsulation layer 21 on the substrate base plate 10 with the foregoing pattern formed, wherein the first inorganic encapsulation layer 21 is located in the display region and the bezel region; forming an organic encapsulation layer 22 on the first inorganic encapsulation layer 21, wherein the organic encapsulation layer 22 is not provided at the first dam position and the second dam position; and forming a second inorganic encapsulation layer 23 on the substrate base plate on which the organic encapsulation layer 22 is formed. The second inorganic encapsulation layer 23 is located in the display region and the bezel region, as shown in FIG. 7a. FIG. 7a is a schematic view showing a structure of a display panel after a thin film encapsulation structure layer is formed therein.

Figure 7B:
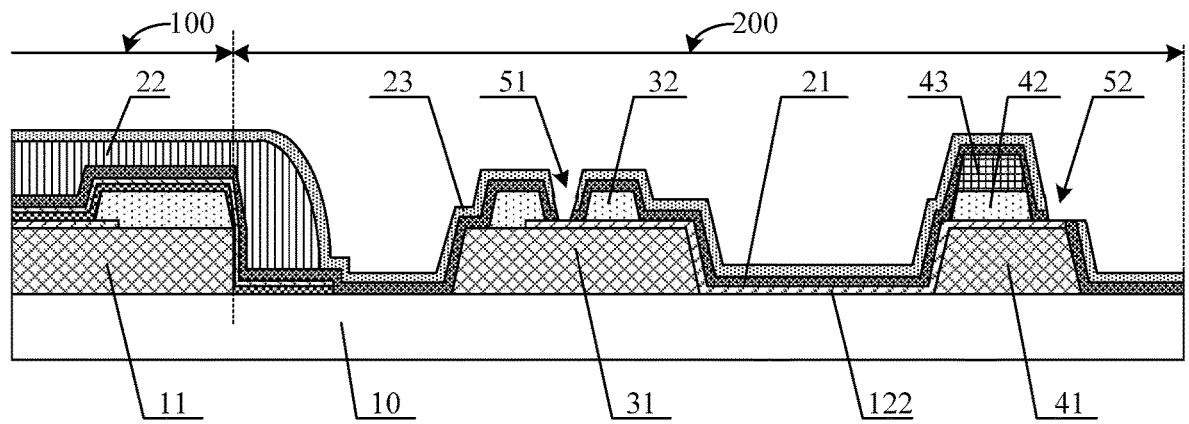
FIG. 7b is a schematic view showing a structure of a display panel after a first via hole and a second via hole are formed therein.

In S212, the second inorganic encapsulation layer and the first inorganic encapsulation layer are patterned, first via holes 51 for exposing the metal connection bridges 122 are formed at positions of the transition via holes 53, and second via holes 52 for exposing the metal connection bridges 122 are formed on the side of the fourth sub-dam 42 facing away from the display region. The step may include: coating photoresist on the thin film encapsulation structure layer; exposing and developing the photoresist by using a mask, removing the photoresist at positions of the first via holes 51 and the second via holes 52, and retaining the photoresist at other positions; and etching the second inorganic encapsulation layer 23 and the first inorganic encapsulation layer 21 at the positions of the first via holes 51 and the second via holes 52 to form the first via holes 51 and the second via holes 52. The metal connection bridges 122 may be exposed through the first via holes 51, and the metal connection bridges 122 may be exposed through the second via holes 52 on the side of the fourth sub-dam 42 facing away from the display region, as shown in FIG. 7b. FIG. 7b is a schematic view showing a structure of a display panel after a first via hole and a second via hole are formed therein.

In S213, a first touch metal layer is formed on the substrate base plate with the foregoing pattern formed. The first touch metal layer includes touch electrodes 63 arranged in an array, first metal leads 61 electrically connected to the touch electrodes 63, and second metal leads 62 located in the bezel region. The first metal leads 61 are located on the side of the dam structure facing the display region. The second metal leads 62 are located on a side of the dam structure facing away from the display region. The first metal leads 61 are electrically connected to the metal connection bridges 122 through the first via holes 51, and the second metal leads 62 are electrically connected to the metal connection bridges 122 through the second via holes 52, so that the first metal leads 61 and the second metal leads 62 are electrically connected through the metal connection bridges 122. The step may include: depositing a first touch metal thin film on the substrate base plate with the foregoing pattern formed; and patterning the first touch metal thin film to form multiple touch electrodes 61, multiple first metal leads 61, and multiple second metal leads 62 on the thin film encapsulation structure layer of the display region. The multiple touch electrodes may be arranged in an array, the multiple first metal leads 61 are connected to touch electrode rows or touch electrode columns in a one-to-one correspondence mode, the first metal leads 61 are located on the side of the dam structure facing the display region. The first metal leads 61 may be electrically connected to the metal connection bridges 122 through the first via holes 51. The second metal leads 62 are located on the side of the dam structure facing away from the display region. The second metal leads 62 may be electrically connected to the metal connection bridges 122 through the second via holes 52. Thus, the second metal leads 62 and the first metal leads 61 are electrically connected in one-to-one correspondence through corresponding metal connection bridges 122, as shown in FIGS. 2 and 3. It will be readily understood that in order to electrically connect the second metal leads 62 and the first metal leads 61 in one-to-one correspondence through the corresponding metal connection bridges 122, the number of the first metal leads 61, the number of the second metal leads 62 and the number of the metal connection bridges 122 may all be equal, so that the second metal leads 62 and the first metal leads 61 may be electrically connected in one-to-one correspondence through the corresponding metal connection bridges 122. The first touch metal layer may further include a first electrode connecting line 64. The first electrode connecting line 64 is configured to be electrically connected to two adjacent touch electrodes in a same row or in a same column. In an exemplary embodiment, the first electrode connecting line 64 is configured to be electrically connected to two adjacent touch electrodes in a same column, as shown in FIG. 2.

In S214, a touch insulating layer is formed on the substrate base plate with the foregoing pattern formed. The step may include: depositing a touch insulating thin film on the substrate base plate with the foregoing pattern formed, and patterning the touch insulating thin film to form a touch insulating layer. Third via holes for exposing the touch electrodes in the row direction are formed on the touch insulating layer.

In S215, a second touch metal layer is formed on the substrate base plate with the foregoing pattern formed. The second touch metal layer includes a second electrode connecting line 71, and the second electrode connecting line 71 may electrically connect the touch electrodes in the same row direction through a third via hole penetrating through the touch insulating layer, as shown in FIG. 2. When the first electrode connecting line is configured to electrically connecting the two adjacent touch electrodes in the same row, the second electrode connecting line may penetrate through the touch insulating layer to electrically connect two adjacent touch electrodes in the same column.

In S216, a touch planarization layer is formed on the substrate base plate with the foregoing pattern formed. A material of the touch planarization layer may include an organic material, and the touch planarization layer may be formed by a coating method.

Subsequent processes may then be made as desired.

Figure 8A:
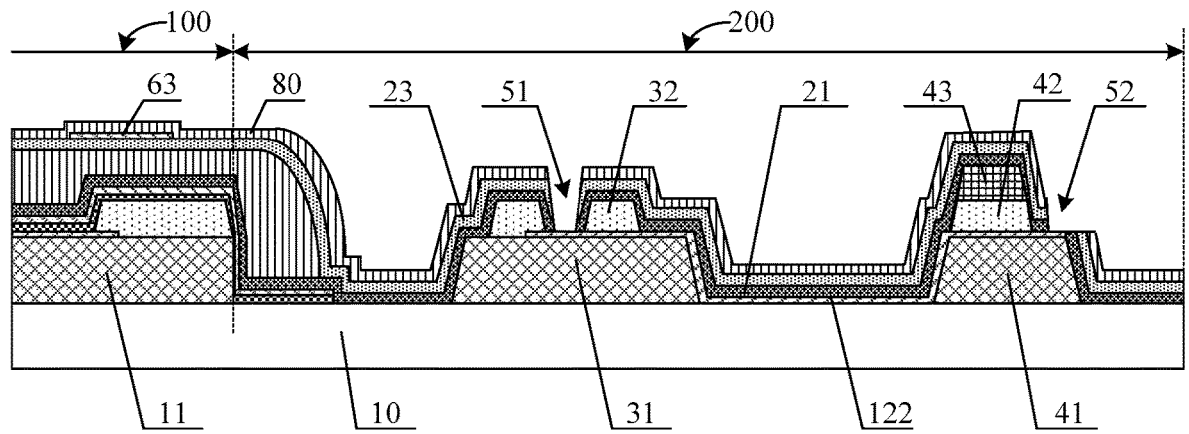
FIG. 8a is a schematic view showing a structure of a display panel after a touch insulating layer is formed therein according to an exemplary embodiment.
Figure 8B:
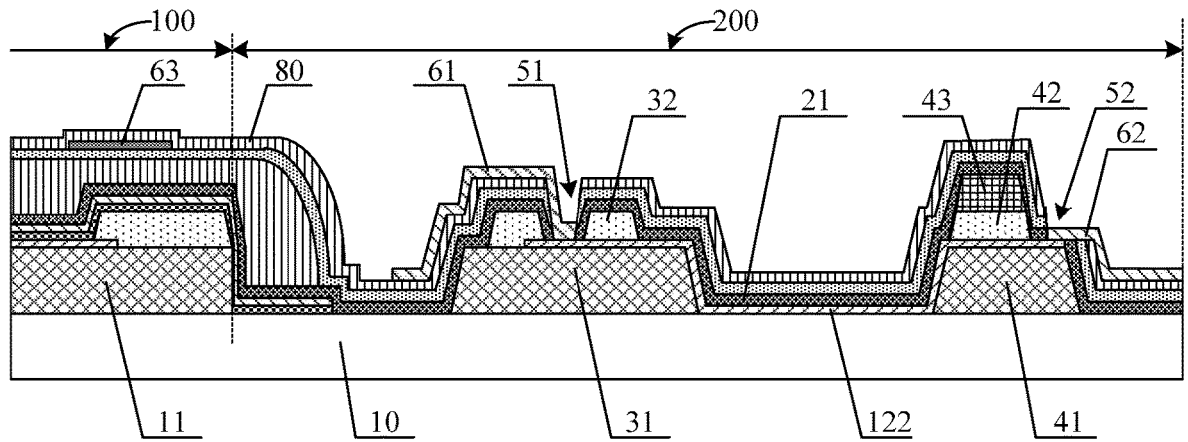
FIG. 8b is a schematic view showing a cross-sectional structure along B-B of a display panel according to an exemplary embodiment.

FIG. 8b is a schematic view showing a cross-sectional structure along B-B of a display panel in an exemplary embodiment. In the embodiment shown in FIG. 3, the first metal leads 61 and the second metal leads 62 may all be arranged in the first touch metal layer. In an exemplary embodiment, as shown in FIG. 8b, the first metal leads 61 and the second metal leads 62 may be arranged in the second touch metal layer. In the embodiment shown in FIG. 8b, S2 may include S221-S224.

S221 is the same as S211, and detailed descriptions thereof are omitted herein.

In S222, a first touch metal layer is formed on the substrate base plate with the foregoing pattern formed. The first touch metal layer may include touch electrodes 63 and first electrode connecting lines 64 arranged in an array, as shown in FIGS. 2 and 8a (the first electrode connecting lines are not shown in FIG. 8a). FIG. 8a is a schematic view showing a structure of a display panel after a touch insulating layer is formed therein in another embodiment. A first electrode connecting line 64 is configured to be electrically connected to two adjacent touch electrodes in a same row or a same column. In the present embodiment, the first electrode connecting line 64 is configured to be electrically connected to two adjacent touch electrodes in a same column. The touch electrodes 63 and the first electrode connecting lines 64 may all be located in the display region.

In S223, a touch insulating layer is formed on the first touch metal layer. The step may include: depositing a touch insulating thin film on the substrate base plate with the foregoing pattern formed, and patterning the touch insulating thin film, the second inorganic encapsulation layer 23, and the first inorganic encapsulation layer 21 to form a touch insulating layer 80, as shown in FIG. 8a. The touch insulating layer 80, the second inorganic encapsulation layer 23, and the first inorganic encapsulation layer 21 may be provided with first via holes 51 located at positions of the transition via holes 53, and the metal connection bridges 122 may be exposed through the first via holes 51. The touch insulating layer 80, the second inorganic encapsulation layer 23, and the first inorganic encapsulation layer 21 may also be provided with second via holes 52. The second via holes 52 are located on the side of the fourth sub-dam 42 facing away from the display region. The metal connection bridges 122 may be exposed through the second via holes 52. The touch insulating layer is provided with the via holes for exposing the touch electrodes, so that second electrode connecting lines to be formed subsequently may be electrically connected to the touch electrodes through the via holes.

In S224, a second touch metal layer is formed on the touch insulating layer, wherein the second touch metal layer include second electrode connecting lines 71, first metal leads 61, and second metal leads 62. The step may include: depositing a second touch metal thin film on the touch insulating layer, and patterning the second touch metal thin film to form second electrode connecting lines 71, multiple first metal leads 61, and multiple second metal leads 62. The first metal leads 61 are located on a side of the dam structure facing the display region, and the second metal leads 62 are located on a side of the dam structure facing away from the display region, as shown in FIGS. 2 and 8b (the second electrode connecting lines 71 are not shown in FIG. 8b). The second electrode connecting lines 71 may be electrically connected to the touch electrodes in the same row direction through via holes penetrating through the touch insulating layer. One end of the first metal leads 61 may be electrically connected to a corresponding touch electrode row or touch electrode column by via holes penetrating through the touch insulating layer, and the other end of the first metal leads 61 may be electrically connected to the metal connection bridges 122 by the first via holes 51 penetrating through the touch insulating layer 80, the second inorganic insulating layer 23, and the first inorganic insulating layer 21. The second metal leads 62 may be electrically connected to the metal connection bridges 122 by the second via holes 52 penetrating through the touch insulating layer 80, the second inorganic insulating layer 23, and the first inorganic insulating layer 21. Thus, the second metal leads 62 and the first metal leads 61 are electrically connected in one-to-one correspondence through the corresponding metal connection bridges 122, as shown in FIGS. 2 and 8b. In order to electrically connect the second metal leads 62 and the first metal leads 61 in one-to-one correspondence through the corresponding metal connection bridges 122, the number of the first metal leads 61, the number of the second metal leads 62 and the number of the metal connection bridges 122 may all be equal, so that the second metal leads 62 and the first metal leads 61 may be electrically connected in one-to-one correspondence through the corresponding metal connection bridges 122.

Figure 9:
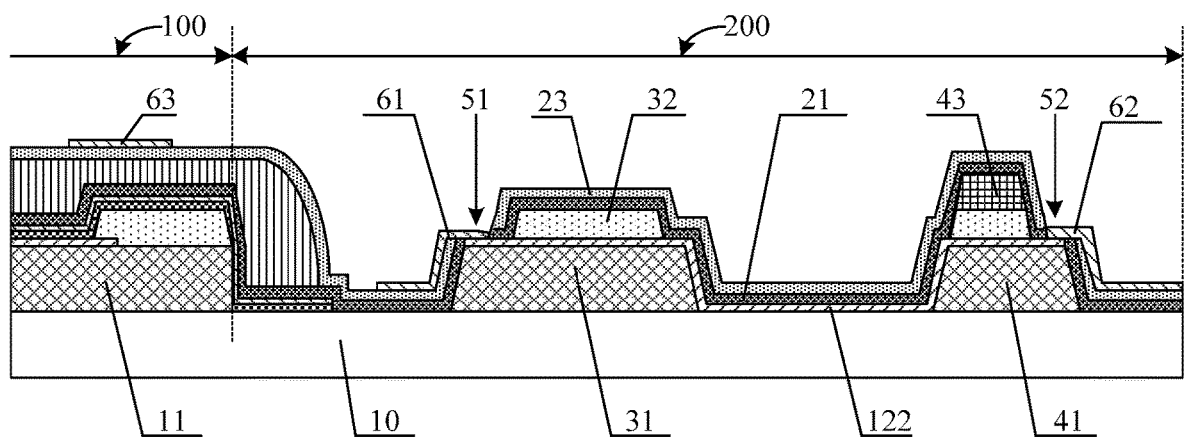
FIG. 9 is a schematic view showing a cross-sectional structure along B-B of a display panel according to an exemplary embodiment.

FIG. 9 is a schematic view showing a cross-sectional structure along B-B of a display panel in an exemplary embodiment. The structure of the second dam 40 may be combined into the embodiment shown in FIG. 4, as shown in FIG. 9. In the embodiment shown in FIG. 9, the structure of the second dam is the same as the features of the embodiment shown in FIG. 3, and detailed descriptions thereof are omitted herein.

In the embodiment shown in FIG. 9, S1 may include S121-S126.

S121, S122, and S123 are respectively the same as S111, S112, and S113 in the above-described embodiments, and detailed descriptions thereof are omitted herein.

Figure 10A:
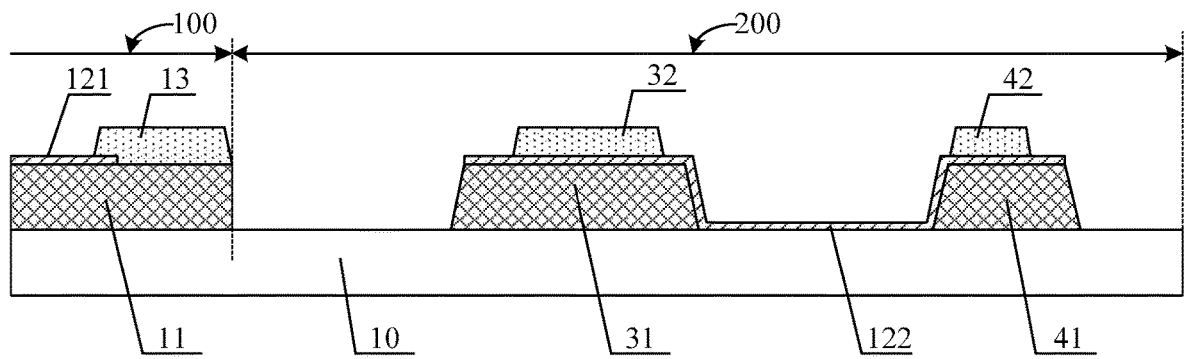
FIG. 10a is a schematic view showing a structure of a display panel after a second sub-dam and a fourth sub-dam are formed therein according to an exemplary embodiment.

In S124, a pixel definition layer located in the display region and a second sub-dam and a fourth sub-dam located in the bezel region are formed on the substrate base plate with the foregoing pattern formed. The step may include: forming a pixel definition thin film on the substrate base plate 10 with the foregoing pattern formed; and patterning the pixel definition thin film to form a pixel definition layer 13 on the anode 121 in the display region, forming a second sub-dam 32 stacked on the first sub-dam 31 on the metal connection bridges 122, forming a fourth sub-dam 42 stacked on the third sub-dam 41 on the metal connection bridges 122, and removing the pixel definition thin film at other positions, as shown in FIG. 10a. FIG. 10a is a schematic view showing a structure of a display panel after a second sub-dam and a fourth sub-dam are formed therein in an exemplary embodiment. A side wall (left side wall) of the second sub-dam 32 facing the display region is away from the display region relative to a side wall (left side wall) of the first sub-dam 31 facing the display region, so that the metal connection bridges 122 are exposed at positions on a left side of the left side wall of the second sub-dam 32 and above the first sub-dam 31. A side wall (right side wall) of the fourth sub-dam 42 facing away from the display region is close to the display region relative to a side wall (right side wall) of the third sub-dam 41 facing away from the display region, so that the metal connection bridges 122 are exposed at positions on a right side of the right side wall of the fourth sub-dam 42 and above the third sub-dam 41, as shown in FIG. 10a.

S125 and S126 are respectively the same as S115 and S116 in the first embodiment, and detailed descriptions thereof are omitted herein.

S2 may include S231-S236.

S231 is the same as S211 in the above-described embodiment, and detailed descriptions thereof are omitted herein.

Figure 10B:
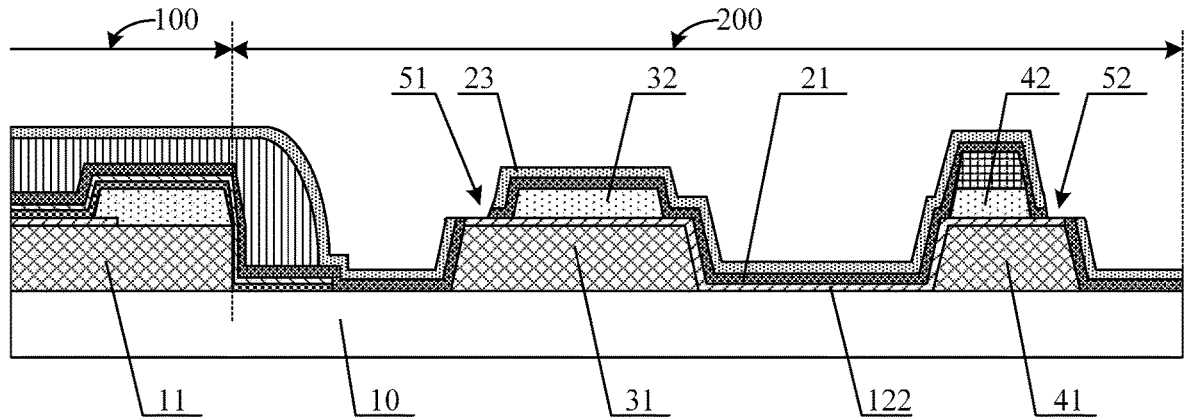
FIG. 10b is a schematic view showing a structure of a display panel after a first via hole and a second via hole are formed therein according to an exemplary embodiment.

In S232, the second inorganic encapsulation layer and the first inorganic encapsulation layer are patterned, first via holes 51 for exposing the metal connection bridges are formed on a side of the second sub-dam 32 facing the display region, and second via holes 52 for exposing the metal connection bridges are formed on a side of the fourth sub-dam facing away from the display region. The step may include: coating photoresist on the thin film encapsulation structure layer; exposing and developing the photoresist by using a mask, removing the photoresist at positions of the first via holes 51 and the second via holes 52, and retaining the photoresist at other positions; and etching the second inorganic encapsulation layer 23 and the first inorganic encapsulation layer 21 at the positions of the first via holes 51 and the second via holes 52 to form the first via holes 51 and the second via holes 52. The metal connection bridges 122 are exposed on the side of the second sub-dam 32 facing the display region through the first via holes 51, and the metal connection bridges 122 are exposed through the second via holes 52 on the side of the fourth sub-dam 42 facing away from the display region, as shown in FIG. 10b. FIG. 10b is a schematic view showing a structure of a display panel after a first via hole and a second via hole are formed therein in an exemplary embodiment. The first via holes 51 are located on the side of the second sub-dam 32 facing the display region and above the first sub-dam 31, and the second via holes 52 are located on the side of the fourth sub-dam 42 facing away from the display region and above the third sub-dam 41.

S233, S234, S235, and S236 are respectively the same as S213, S214, S215, and S216 in the above-described embodiment, and detailed descriptions thereof are omitted herein.

Figure 11:
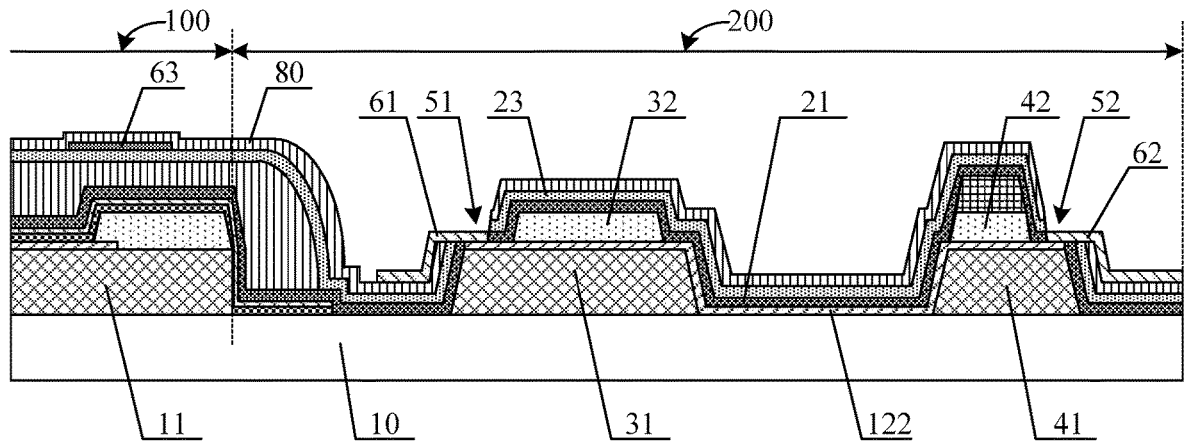
FIG. 11 is a schematic view showing a cross-sectional structure along B-B of a display panel according to an exemplary embodiment.

FIG. 11 is a schematic view showing a cross-sectional structure along B-B of a display panel in an exemplary embodiment. In the embodiment shown in FIG. 9, the first metal leads 61 and the second metal leads 62 may all be arranged in the first touch metal layer. In the embodiment shown in FIG. 11, the first metal leads 61 and the second metal leads 62 may be arranged in the second touch metal layer. In this case, S2 may include S241-S244.

S241 and S242 are the same as S221 and S222 in the above-described embodiment, and detailed descriptions thereof are omitted herein.

Figure 12:
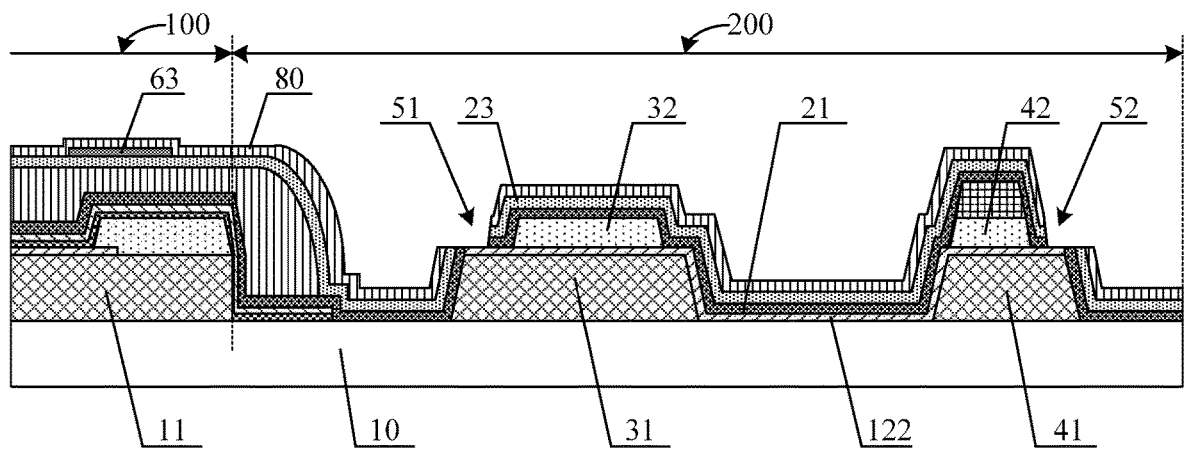
FIG. 12 is a schematic view showing a structure of a display panel after a touch insulating layer is formed therein according to an exemplary embodiment.

In S243, a touch insulating layer is formed on the first touch metal layer. The step may include: depositing a touch insulating thin film on the substrate base plate with the foregoing pattern formed, and patterning the touch insulating thin film, the second inorganic encapsulation layer 23, and the first inorganic encapsulation layer 21 to form a touch insulating layer 80, as shown in FIG. 12. FIG. 12 is a schematic view showing a structure of a display panel after a touch insulating layer is formed therein in an exemplary embodiment. The touch insulating layer 80, the second inorganic encapsulation layer 23, and the first inorganic encapsulation layer 21 may be provided with first via holes 51. The first via holes 51 are located on a side of the second sub-dam 32 facing the display region. The metal connection bridges 122 may be exposed through the first via holes 51. The touch insulating layer 80, the second inorganic encapsulation layer 23, and the first inorganic encapsulation layer 21 may also be provided with second via holes 52. The second via holes 52 are located on a side of the fourth sub-dam 42 facing away from the display region. The metal connection bridges 122 may be exposed through the second via holes 52. The touch insulating layer is provided with via holes for exposing the touch electrodes, so that the second electrode connecting lines to be formed subsequently may be electrically connected to the touch electrodes through the via holes.

S244 is the same as S224 in the foregoing embodiment, and detailed descriptions thereof are omitted herein.

Figure 13:
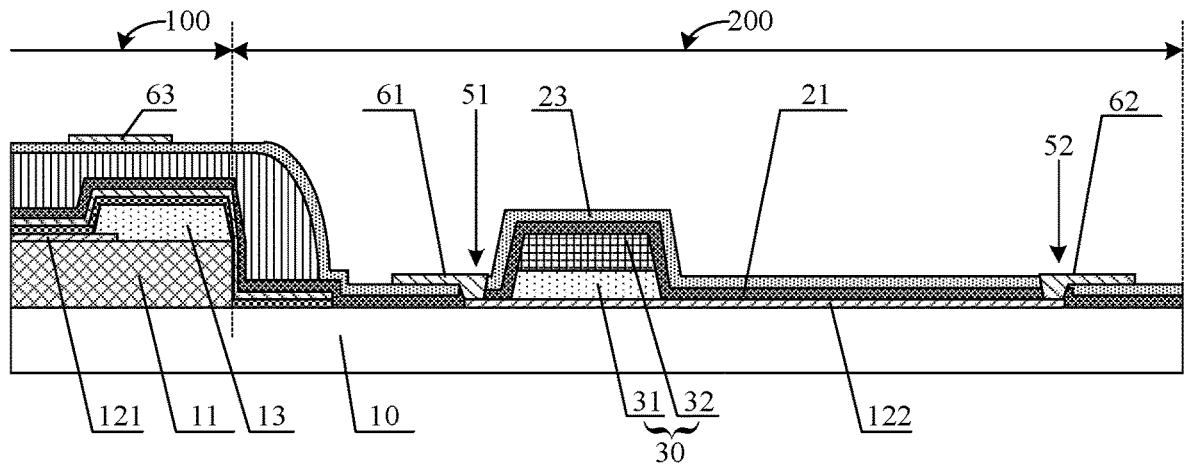
FIG. 13 is a schematic view showing a cross-sectional structure along B-B of a display panel according to an exemplary embodiment of the present disclosure.

FIG. 13 is a schematic view showing a cross-sectional structure along B-B of a display panel in an exemplary embodiment of the present disclosure. In an exemplary embodiment, the metal connection bridges 122 may be arranged between the dam structure and the substrate base plate 10, as shown in FIG. 13.

In an exemplary embodiment, as shown in FIG. 13, the dam structure includes a first dam 30, and the metal connection bridges 122 are arranged between the first dam 30 and the substrate base plate 10. The first metal leads 61 and the metal connection bridges 122 are lapped on a side of the first dam 30 facing the display region. In FIG. 13, an inorganic encapsulation layer is arranged between the dam structure 30 and the first metal leads 61. The first metal leads 61 and the metal connection bridges 122 are lapped on the side of the first dam 30 facing the display region through the first via holes 51. That is, the first metal leads 61 and the metal connection bridges 122 may be lapped on the left side of the first dam 30 through the first via holes 51, and the first via holes 51 penetrates through the inorganic encapsulation layer.

With such a structure, the first metal leads 61 do not need to climb onto the first dam. Thus, in a process of forming the first metal leads 61, influence of the slope angle of the dam on the processes can be avoided, photoresist residue and metal residue are eliminated, and the short circuit problem between the first metal leads 61 is avoided. The metal connection bridges 122 may be directly formed on a planar surface. Thus, in a process of forming the metal connection bridges 122 on the planar surface, photoresist residue and metal residue can be eliminated, and the short circuit problem between the metal connection bridges 122 is eliminated, thereby eliminating the short circuit problem between the touch electrode leads.

In an exemplary embodiment, as shown in FIG. 13, the first dam 30 may include a first sub-dam 31 arranged on the metal connection bridges 122, and a second sub-dam 32 stacked on a side of the first sub-dam 31 facing away from the substrate base plate 10. In an exemplary embodiment, the metal connection bridges 122 and the anode 121 of the display region 100 may be arranged on a same layer, that is, the metal connection bridges 122 and the anode 121 of the display region 100 may be formed by one patterning process. The first sub-dam 31 and the pixel definition layer 13 of the display region may be arranged on a same layer, that is, the first sub-dam 31 and the pixel definition layer 13 of the display region may be formed by one patterning process. Therefore, the manufacturing processes of the display panel can be simplified, and the cost is reduced.

In an exemplary embodiment, as shown in FIGS. 2 and 13, the touch electrode leads may further include second metal leads 62. The second metal leads 62 are arranged on a same layer as the first metal leads 61. The second metal leads 62 and the first metal leads 61 are in one-to-one correspondence. The second metal leads 62 may be arranged on a side of the first dam 30 away from the display region. The metal connection bridges 122 and the second metal leads 62 are electrically connected on a side of the first dam 30 facing away from the display region. That is, the metal connection bridges 122 and the second metal leads 62 may be electrically connected on the right side of the first dam 30. With such a structure, the second metal leads 62 may be formed on a planar surface on the right side of the first dam 30. In a process of forming the second metal leads 62 on the planar surface, photoresist residue and metal residue can be eliminated, and the short circuit problem between adjacent second metal leads 62 is eliminated, thereby eliminating the short circuit problem between the touch electrode leads.

Figure 14:
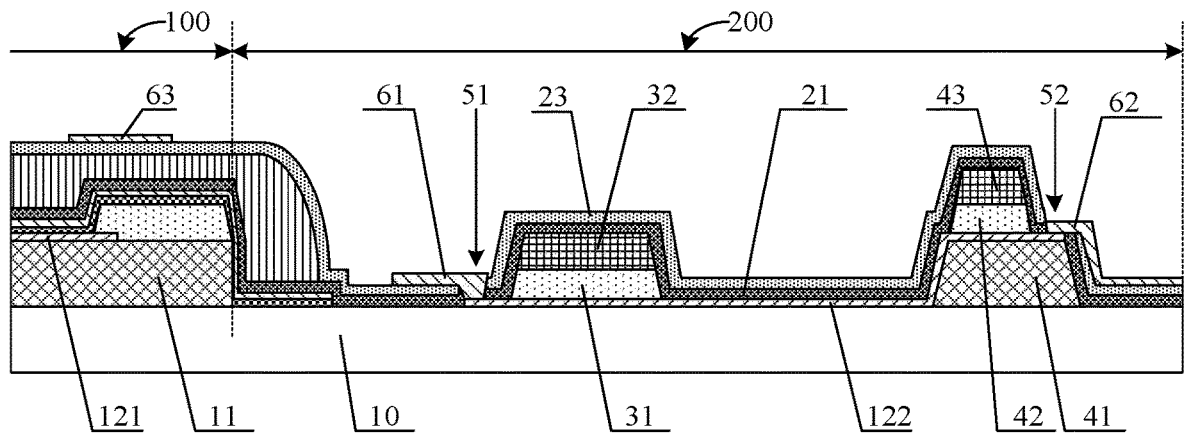
FIG. 14 is a schematic view showing a cross-sectional structure along B-B of a display panel according to an exemplary embodiment of the present disclosure.

FIG. 14 is a schematic view showing a cross-sectional structure along B-B of a display panel in an exemplary embodiment of the present disclosure. In an exemplary embodiment, as shown in FIG. 14, the dam structure further includes a second dam 40. The second dam 40 is arranged on a side of the first dam 30 facing away from the display region 100. The touch electrode leads further include second metal leads 62. The second metal leads 62 may be arranged on a same layer as the first metal leads 61. The second metal leads 62 are arranged on a side of the second dam 40 away from the display region 100. The metal connection bridges 122 and the second metal leads 62 are electrically connected on a side of the second dam 40 facing away from the display region. That is, the metal connection bridges 122 and the second metal leads 62 may be electrically connected on a right side of a right side wall connecting line of the second dam 40.

In an exemplary embodiment, as shown in FIG. 14, the second dam includes a third sub-dam 41, a fourth sub-dam 42, and a fifth sub-dam 43 which are sequentially stacked on the substrate base plate 10. The third sub-dam 41 and the planarization layer 11 of the display region may be arranged on a same layer. The fourth sub-dam 42, the first sub-dam 31, and the pixel definition layer of the display region may be arranged on a same layer. The fifth sub-dam 43 and the second sub-dam 32 may be arranged on a same layer. The metal connection bridges 122 and the anode 121 of the display region may be arranged on a same layer, and the metal connection bridges 122 are located between the third sub-dam 41 and the fourth sub-dam 42. The structure and positions of the second via holes 53 may be the same as those in the foregoing embodiment.

The substrate base plate 10 may include a thin film transistor located in the display region, and source and drain electrodes of the thin film transistor may be arranged on a side of the substrate base plate 10 facing the planarization layer 11. In an exemplary embodiment, the metal connection bridges 122 may be arranged on a same layer as the source electrode or the drain electrode of the thin film transistor of the display region. The first sub-dam 31, the third sub-dam 41, and the planarization layer 11 of the display region 100 may be arranged on a same layer. The second sub-dam 32, the fourth sub-dam 42, and the pixel definition layer 13 of the display region 100 may be arranged on a same layer. In such a structure, the metal connection bridges are located between the first dam and the substrate base plate 10, the metal connection bridges are located between the second dam and the substrate base plate 10, and the metal connection bridges and the second metal leads are lapped on a side of the second dam facing away from the display region.

In the embodiment shown in FIG. 14, S1 may include S131-S135.

S131 is the same as S121 in the foregoing embodiment, and detailed descriptions thereof are omitted herein.

Figure 15A:
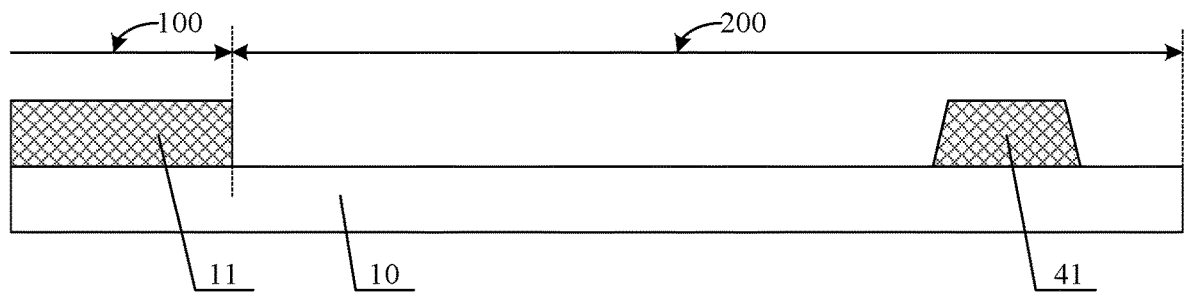
FIG. 15a is a schematic view showing a structure of a display panel after a third sub-dam is formed therein according to an exemplary embodiment.

In S132, a planarization layer 11 located in the display region and a third sub-dam 41 located in the bezel region are formed on the substrate base plate 10. The step may include: forming a planar thin film on the substrate base plate 10; and patterning the planar thin film to form a planarization layer 11 located in the display region, retaining the planar thin film at a second dam position, forming a third sub-dam 41 located at the second dam position, and removing the planar thin film at other positions, as shown in FIG. 15a. FIG. 15a is a schematic view showing a structure of a display panel after a third sub-dam is formed therein in an exemplary embodiment. A material of the planar thin film may include an organic material, and the planar thin film is formed by using a coating process.

Figure 15B:
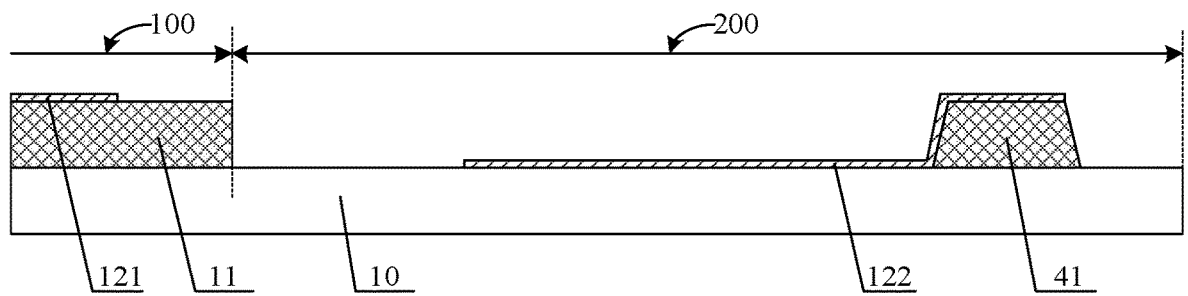
FIG. 15b is a schematic view showing a structure of a display panel after a metal connection bridge is formed therein according to an exemplary embodiment.

In S133, an anode located in the display region and metal connection bridges located in the bezel region are formed on the substrate base plate with the foregoing pattern formed. The step may include: depositing a first metal thin film on the substrate base plate 10 with the foregoing pattern formed; and patterning the first metal thin film to form an anode 121 on the planarization layer 11 in the display region, and forming metal connection bridges 122 on the third sub-dam 41 in the bezel region. The metal connection bridges 122 cover a surface (upper surface) of the third sub-dam 41 facing away from the substrate base plate 10, the metal connection bridges 122 cover the position of the first dam, and the first metal thin film at other positions is removed, as shown in FIG. 15b. FIG. 15b is a schematic view showing a structure of a display panel after a metal connection bridge is formed therein in an exemplary embodiment. A material of the first metal thin film may be selected from materials commonly used for anodes in OLED devices, which are not limited here.

In S134, a pixel definition layer located in the display region and a second sub-dam and a fourth sub-dam located in the bezel region are formed on the substrate base plate with the foregoing pattern formed. The step may include: forming a pixel definition thin film on the substrate base plate 10 with the foregoing pattern formed; and patterning the pixel definition thin film to form a pixel definition layer 13 on the anode 121 in the display region, forming a first sub-dam 31 on the metal connection bridges 122 at the first dam position, forming a fourth sub-dam 42 stacked on the third sub-dam 41 on the metal connection bridges 122, and removing the pixel definition thin film at other positions.

Figure 15C:
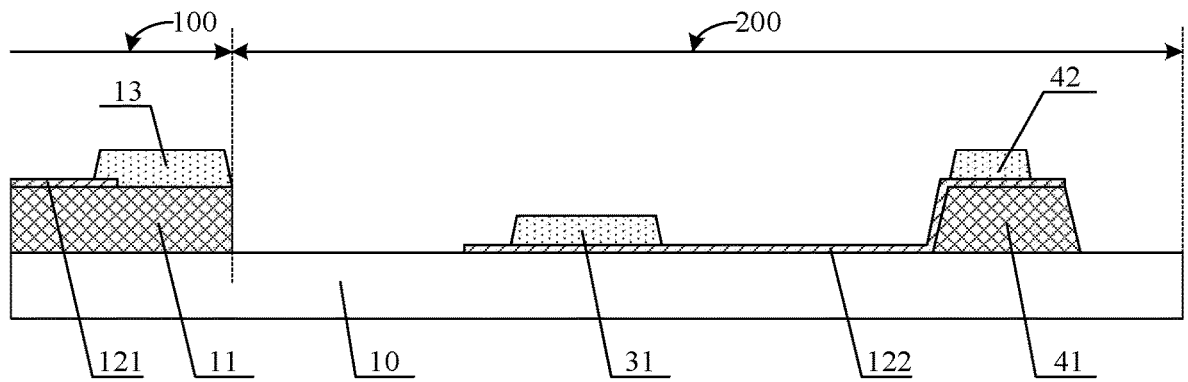
FIG. 15c is a schematic view showing a structure of a display panel after a first sub-dam and a fourth sub-dam are formed therein according to an exemplary embodiment.

The first sub-dam 31 is located on a side of the fourth sub-dam 42, facing the display region, as shown in FIG. 15c. FIG. 15c is a schematic view showing a structure of a display panel after a first sub-dam and a fourth sub-dam are formed therein in an exemplary embodiment. The metal connection bridges 122 are exposed on a side of the first sub-dam 31 close to the display region, so that the first via holes 51 to be formed subsequently may be located on the side of the first sub-dam 31 facing the display region. A side wall of the fourth sub-dam 42 facing away from the display region is close to the display region relative to a side wall of the third sub-dam 41 facing away from the display region, so that the metal connection bridges 122 are exposed on a side of the fourth sub-dam 42 facing away from the display region, as shown in FIG. 15c.

Figure 15D:
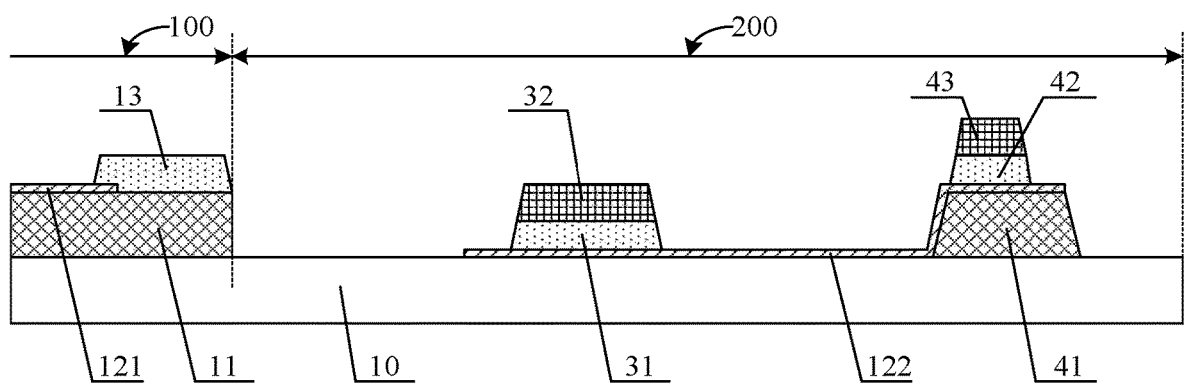
FIG. 15d is a schematic view showing a structure of a display panel after a second sub-dam and a fifth sub-dam are formed therein according to an exemplary embodiment.

In S135, a second sub-dam 32 stacked on the first sub-dam 31 and a fifth sub-dam 43 stacked on the fourth sub-dam 42 are formed on the substrate base plate with the foregoing pattern formed. The step may include: forming an spacer thin film on the substrate base plate with the foregoing pattern formed; and patterning the spacer thin film to form a first spacer post (i.e. the fifth sub-dam 43) stacked on the fourth sub-dam 42 and a second spacer post (i.e. the second sub-dam 32) stacked on the first sub-dam 31, and removing the spacer thin film at other positions, as shown in FIG. 15d. FIG. 15d is a schematic view showing a structure of a display panel after a second sub-dam and a fifth sub-dam are formed therein in an exemplary embodiment. A material of the spacer thin film may be determined as desired, which is not limited here.

The other steps may be the same as the related steps in the foregoing embodiments, and detailed descriptions thereof are omitted herein.

Figure 16:
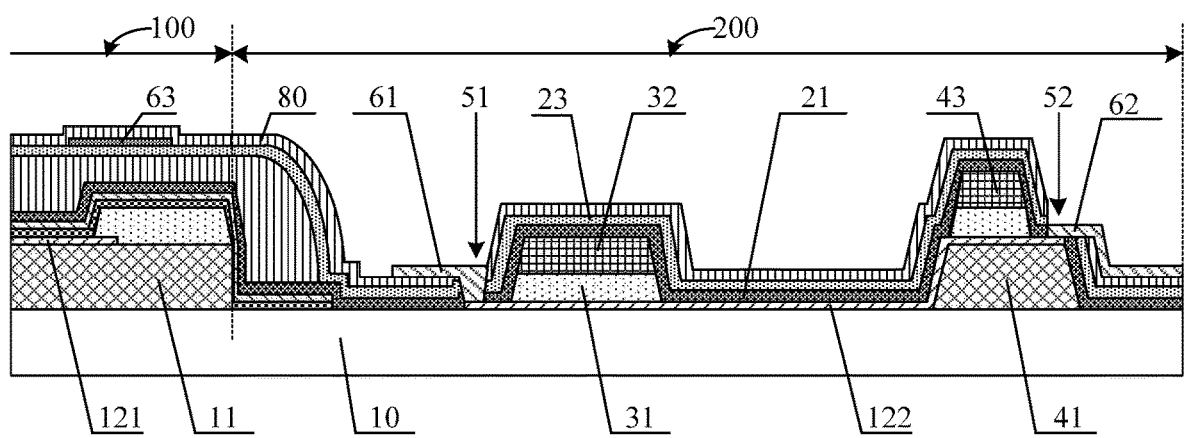
FIG. 16 is a schematic view showing a cross-sectional structure along B-B of a display panel according to an exemplary embodiment.

FIG. 16 is a schematic view showing a cross-sectional structure along B-B of a display panel in an exemplary embodiment. The embodiment shown in FIG. 16 differs from the embodiment shown in FIG. 14 in that: in the embodiment shown in FIG. 14, the first metal leads 61 and the second metal leads 62 may all be arranged in the first touch metal layer. In the embodiment shown in FIG. 16, the first metal leads 61 and the second metal leads 62 may all be arranged in the second touch metal layer. In a method for forming the display panel of the embodiment shown in FIG. 16, S1 may be the same as that in the embodiment shown in FIG. 14, S2 may be the same as that in the embodiment shown in FIG. 11, and detailed descriptions thereof are omitted herein.

In an exemplary embodiment, the second dam includes a third sub-dam, a fourth sub-dam, and a fifth sub-dam. The third sub-dam may be arranged on the substrate base plate, the fourth sub-dam may be stacked on a side of the third sub-dam facing away from the substrate base plate, and the fifth sub-dam may be stacked on a side of the fourth sub-dam facing away from the substrate base plate. The metal connection bridges may be arranged between the fourth sub-dam and the fifth sub-dam, and positions of electric connection between the metal connection bridges and the second metal leads are located on a side of the fifth sub-dam facing away from the display region.

In an exemplary embodiment, the film layer structures of the display panel in the above-described embodiment may be combined with each other if there is no conflict.

In an exemplary embodiment, the dam structure may further include multiple dams arranged between the first dam and the second dam. The first metal leads and the second metal leads may be arranged on a side of the dam structure facing the display region and a side of the dam structure facing away from the display region, respectively, and the first metal leads and the second metal leads are electrically connected through the metal connection bridges.

Another exemplary embodiment of the present disclosure provides a method for manufacturing a display panel. As shown in FIG. 5, the display panel includes a display region and a bezel region. The method includes:
- forming a dam structure and metal connection bridges located on a substrate base plate in the bezel region, wherein the metal connection bridges are arranged between the substrate base plate and a surface of the dam structure away from the substrate base plate; and
- forming first metal leads located on a side of the dam structure facing away from the substrate base plate in the bezel region, wherein the first metal leads extend from the display region to the bezel region, the first metal leads are located on a side of the dam structure facing the display region, and are electrically connected to the metal connection bridges.

In an exemplary embodiment of the present disclosure, the step of forming the dam structure and the metal connection bridges located on the substrate base plate in the bezel region includes:
- forming the metal connection bridges located on the substrate base plate in the bezel region;
- forming a first dam located on the metal connection bridges in the bezel region, wherein the metal connection bridges are exposed on a side of the first dam facing the display region, and the dam structure includes the first dam; and
- the first metal leads and the metal connection bridges are lapped on the side of the first dam facing the display region.

In an exemplary embodiment of the present disclosure, the step of forming the dam structure and the metal connection bridges located on the substrate base plate in the bezel region includes:
- forming a first sub-dam and a third sub-dam located on the substrate base plate in the bezel region, wherein the third sub-dam is located on a side of the first sub-dam facing away from the display region;
- forming metal connection bridges located on the first sub-dam and the third sub-dam in the bezel region;
- forming a second sub-dam and a fourth sub-dam located on the metal connection bridges in the bezel region, wherein the second sub-dam is stacked on the first sub-dam, and the fourth sub-dam is stacked on the third sub-dam; and
- forming a fifth sub-dam stacked on the fourth sub-dam in the bezel region, wherein the dam structure includes a first dam and a second dam, the first dam includes the first sub-dam and the second sub-dam, the second dam includes the third sub-dam, the fourth sub-dam, and the fifth sub-dam.

The step of forming the first metal leads located on the side of the dam structure facing away from the substrate base plate in the bezel region includes:
- forming, in the bezel region, first metal leads and second metal leads located on the side of the dam structure facing away from the substrate base plate. The first metal leads extend from the display region to the bezel region and are located on a side of the first dam facing the display region. The second metal leads are located on a side of the second dam facing away from the display region. The first metal leads are electrically connected to the metal connection bridges, and the second metal leads are electrically connected to the metal connection bridges.

The detailed steps of the method for manufacturing the display panel have been described in detail in the foregoing, and will not be described in detail herein.

Another exemplary embodiment of the present disclosure provides a display device including a display panel employing the foregoing embodiments. The display device may be: any product or component with a display function, such as a mobile phone, a tablet computer, a television, a display, a laptop computer, a digital photo frame, or a navigator.

In the description of the embodiments of the present disclosure, an orientation or positional relation indicated by the terms "middle", "up", "down", "front", "back", "vertical", "horizontal", "top", "bottom", "inside", "outside", etc. is based on an orientation or positional relation shown in the drawings, and is merely for the convenience of describing the present disclosure and simplifying the description, rather than indicating or implying that the device or elements referred to must have a particular orientation, and configured and operated in the particular orientation. Thus, it cannot be construed as limitations on the present disclosure.

In the description of the embodiments of the present disclosure, unless otherwise specified and limited, terms "mount", "couple" and "connect" should be understood in a broad sense. For example, a connection may be a fixed connection or a detachable connection or an integral connection, it may be a mechanical connection or an electric connection, or it may be a direct connection or an indirect connection through a middleware or an internal connection between two elements. Those of ordinary skill in the art may understand the meanings of the above terms in the present disclosure according to specific situations.

Although the present disclosure discloses the above implementations, the contents are only implementations adopted for convenience of understanding the present disclosure, and are not intended to limit the present disclosure. Any person skilled in the art to which the present disclosure pertains may make modifications and variations in implementation forms and details without departing from the essence and scope of the present disclosure, but the scope of patent protection of the present disclosure should still be determined by the scope of the appended claims.

What is claimed is:

1. A display panel, comprising:
a substrate base plate, comprising a display region and a bezel region surrounding the display region;
a light emitting element, arranged on a side of the substrate base plate and located in the display region;
a dam structure, located in the bezel region and arranged on the side of the substrate base plate provided with the light emitting element, wherein the dam structure surrounds the display region;
touch electrodes, arranged on a side of the light emitting element away from the substrate base plate, and located in the display region; and
touch electrode leads, comprising first metal leads and metal connection bridges which are electrically connected, wherein the first metal leads are arranged on the dam structure and face away from the substrate base plate, the first metal leads are electrically connected to the touch electrodes, extend from the display region to the bezel region, and are located on a side of the dam structure facing the display region, and the metal connection bridges are located in the bezel region, and are arranged between the substrate base plate and a surface of the dam structure away from the substrate base plate;
wherein the dam structure comprises a first dam, the first dam comprises a first sub-dam and a second sub-dam stacked on a side of the first sub-dam facing away from the substrate base plate, and the metal connection bridges are sandwiched between the first sub-dam and the second sub-dam;
wherein a side wall of the second sub-dam facing the display region is away from the display region relative to a side wall of the first sub-dam facing the display region, the second sub-dam is provided with first via holes exposing the metal connection bridges, the first via holes are located on a surface of the first sub-dam facing away from the substrate base plate, and the first metal leads are electrically connected to the metal connection bridges through the first via holes.

2. The display panel according to claim 1, wherein the metal connection bridges are arranged between the dam structure and the substrate base plate.

3. The display panel according to claim 1, wherein the metal connection bridges penetrate through the dam structure.

4. The display panel according to claim 1, wherein the metal connection bridges are arranged between the first dam and the substrate base plate, and the first metal leads and the metal connection bridges are lapped with each other on a side of the first dam facing the display region.

5. The display panel according to claim 1,
wherein positions of electric connections between the first metal leads and the metal connection bridges are located on a side wall of the first sub-dam facing the display region; or,
positions of electric connections between the first metal leads and the metal connection bridges are located on a side of the first sub-dam facing the display region; or,
a side wall of the second sub-dam facing the display region is away from the display region relative to a side wall of the first sub-dam facing the display region, positions of electric connections between the first metal leads and the metal connection bridges are located on a side of the second sub-dam facing the display region, and positions of electric connections between the first metal leads and the metal connection bridges are located on a surface of the first sub-dam facing the second sub-dam.

6. The display panel according to claim 4, wherein the dam structure further comprises a second dam arranged on a side of the first dam facing away from the display region, the touch electrode leads further comprise second metal leads arranged on a same layer as the first metal leads, the second metal leads are arranged on a side of the second dam away from the display region, and the metal connection bridges are electrically connected to the second metal leads on a side of the second dam facing away from the display region.

7. The display panel according to claim 6, wherein the metal connection bridges are arranged between the second dam and the substrate base plate, and the metal connection bridges and the second metal leads are lapped on the side of the second dam facing away from the display region.

8. The display panel according to claim 6,
wherein the second dam comprises a third sub-dam and a fourth sub-dam stacked on a side of the third sub-dam facing away from the substrate base plate, the metal connection bridges are arranged between the third sub-dam and the fourth sub-dam, and positions of electric connections between the metal connection bridges and the second metal leads are located on a side wall of the third sub-dam facing away from the display region; or, the second dam comprises a third sub-dam and a fourth sub-dam stacked on a side of the third sub-dam facing away from the substrate base plate, the metal connection bridges are arranged between the third sub-dam and the fourth sub-dam, and positions of electric connections between the metal connection bridges and the second metal leads are located on a side of the third sub-dam facing away from the display region; or, the second dam comprises a third sub-dam and a fourth sub-dam stacked on a side of the third sub-dam facing away from the substrate base plate, the metal connection bridges are arranged between the third sub-dam and the fourth sub-dam, a side wall of the fourth sub-dam facing away from the display region is close to the display region relative to a side wall of the third sub-dam facing away from the display region, positions of electric connections between the metal connection bridges and the second metal leads are located on a side of the fourth sub-dam facing away from the display region, and the positions of electric connections between the metal connection bridges and the second metal leads are located on a surface of the third sub-dam facing away from the substrate base plate.

9. The display panel according to claim 6, wherein the second dam comprises a third sub-dam, a fourth sub-dam, and a fifth sub-dam, the third sub-dam is arranged on the substrate base plate, the fourth sub-dam is stacked on a side of the third sub-dam facing away from the substrate base plate, the fifth sub-dam is stacked on a side of the fourth sub-dam facing away from the substrate base plate, the metal connection bridges are arranged between the fourth sub-dam and the fifth sub-dam, and positions of electric connections between the metal connection bridges and the second metal leads are located on a side of the fifth sub-dam facing away from the display region.

10. The display panel according to claim 1, further comprising an inorganic encapsulation layer, wherein the inorganic encapsulation layer is arranged between the dam structure and the first metal leads, and the first metal leads are electrically connected to the metal connection bridges through first via holes penetrating through the inorganic encapsulation layer.

11. A method for manufacturing a display panel, the display panel comprising a display region and a bezel region, and the method comprising:

forming, in the bezel region, a dam structure and metal connection bridges located on a substrate base plate, the metal connection bridges are arranged between the substrate base plate and a surface of the dam structure away from the substrate base plate; and forming, in the bezel region, first metal leads located on the dam structure and facing away from the substrate base plate, wherein the first metal leads extend from the display region to the bezel region, the first metal leads are located on a side of the dam structure facing the display region, and are electrically connected to the metal connection bridges;

wherein the method is used to manufacture the display panel according to claim 1.

12. The method according to claim 11, wherein forming, in the bezel region, the dam structure and the metal connection bridges located on the substrate base plate comprises:

forming, in the bezel region, the metal connection bridges located on the substrate base plate; and forming, in the bezel region, a first dam located on the metal connection bridges, wherein the metal connection bridges are exposed on a side of the first dam facing the display region, the dam structure comprises the first dam, and the first metal leads and the metal connection bridges are lapped on the side of the first dam facing the display region.

13. The method according to claim 11, wherein the step of forming, in the bezel region, the dam structure and the metal connection bridges located on the substrate base plate comprises:

forming, in the bezel region, a first sub-dam and a third sub-dam located on the substrate base plate, wherein the third sub-dam is located on a side of the first sub-dam facing away from the display region;

forming, in the bezel region, the metal connection bridges located on the first sub-dam and the third sub-dam;

forming, in the bezel region, a second sub-dam and a fourth sub-dam located on the metal connection bridges, wherein the second sub-dam is stacked on the first sub-dam, and the fourth sub-dam is stacked on the third sub-dam; and forming, in the bezel region, a fifth sub-dam stacked on the fourth sub-dam, wherein the dam structure comprises a first dam and a second dam, the first dam comprises the first sub-dam and the second sub-dam, and the second dam comprises the third sub-dam, the fourth sub-dam, and the fifth sub-dam;

the step of forming, in the bezel region, the first metal leads located on the side of the dam structure facing away from the substrate base plate comprises:

forming, in the bezel region, the first metal leads and second metal leads located on a side of the dam structure facing away from the substrate base plate, wherein the first metal leads extend from the display region to the bezel region and are located on a side of the first dam facing the display region, the second metal leads are located on a side of the second dam facing away from the display region, the first metal leads are electrically connected to the metal connection bridges, and the second metal leads are electrically connected to the metal connection bridges.

14. A display device, comprising: the display panel according to claim 1.

15. The display panel according to claim 5, wherein the dam structure further comprises a second dam arranged on a side of the first dam facing away from the display region, the touch electrode leads further comprise second metal leads arranged on a same layer as the first metal leads, the second metal leads are arranged on a side of the second dam away from the display region, and the metal connection bridges are electrically connected to the second metal leads on a side of the second dam facing away from the display region.

* * * * *